US011968863B2

(12) United States Patent
Ikeda et al.

(10) Patent No.: US 11,968,863 B2
(45) Date of Patent: Apr. 23, 2024

(54) DISPLAY PANEL, DISPLAY DEVICE, INPUT/OUTPUT DEVICE, AND DATA PROCESSING DEVICE

(71) Applicant: SEMICONDUCTOR ENERGY LABORATORY CO., LTD., Atsugi (JP)

(72) Inventors: Hisao Ikeda, Kanagawa (JP); Masataka Nakada, Tochigi (JP); Tomoya Aoyama, Kanagawa (JP)

(73) Assignee: Semiconductor Energy Laboratory Co., Ltd., Kanagawa-ken (JP)

( * ) Notice: Subject to any disclaimer, the term of this patent is extended or adjusted under 35 U.S.C. 154(b) by 547 days.

(21) Appl. No.: 17/269,042

(22) PCT Filed: Aug. 21, 2019

(86) PCT No.: PCT/IB2019/057029
§ 371 (c)(1),
(2) Date: Feb. 17, 2021

(87) PCT Pub. No.: WO2020/044170
PCT Pub. Date: Mar. 5, 2020

(65) Prior Publication Data
US 2021/0183990 A1  Jun. 17, 2021

(30) Foreign Application Priority Data

Aug. 29, 2018 (JP) .................. 2018-160323

(51) Int. Cl.
*H10K 59/13* (2023.01)
*H10K 59/00* (2023.01)
(Continued)

(52) U.S. Cl.
CPC .......... *H10K 59/131* (2023.02); *H10K 59/00* (2023.02); *H10K 59/121* (2023.02)

(58) Field of Classification Search
CPC .... H10K 59/131; H10K 59/00; H10K 59/121; H10K 50/824; H10K 50/844;
(Continued)

(56) References Cited

U.S. PATENT DOCUMENTS 6,887,100 B2   5/2005  Matsueda et al.
7,161,184 B2   1/2007  Miyagi et al.
(Continued)

FOREIGN PATENT DOCUMENTS

CN      001671255 A      9/2005
CN      101599534 A     12/2009
(Continued)

OTHER PUBLICATIONS

International Search Report (Application No. PCT/IB2019/057029) dated Dec. 3, 2019.
(Continued)

*Primary Examiner* — S M Sohel Imtiaz
(74) *Attorney, Agent, or Firm* — NIXON PEABODY LLP; Jeffrey L. Costellia

(57) ABSTRACT

A display panel is provided. The display panel includes a display region, a functional layer, a first insulating film, and a first conductive film; the display region includes a pixel; the pixel includes a display element and a pixel circuit; the display element includes a first electrode and a second electrode; the second electrode includes a first opening portion; the functional layer includes the pixel circuit, a second opening portion, and an auxiliary wiring; the pixel circuit is electrically connected to the display element in the second opening portion; the auxiliary wiring includes a region overlapping with the first opening portion; the first insulating film includes a third opening portion; the third opening portion includes a region overlapping with the first opening portion; and the first conductive film is electrically
(Continued)

connected to the second electrode and the auxiliary wiring in the third opening portion.

10 Claims, 21 Drawing Sheets

(51) Int. Cl.
*H10K 59/121* (2023.01)
*H10K 59/131* (2023.01)

(58) Field of Classification Search
CPC . H10K 59/1315; G06F 3/0416; G06F 3/0412; G09F 9/30; H05B 33/02
See application file for complete search history.

(56) References Cited

U.S. PATENT DOCUMENTS

| | | | |
|---|---|---|---|
| 7,198,515 B2 | 4/2007 | Matsueda et al. | |
| 7,221,095 B2 | 5/2007 | Yamazaki et al. | |
| 7,224,118 B2 | 5/2007 | Yamazaki et al. | |
| 7,301,276 B2 | 11/2007 | Yamazaki et al. | |
| 7,411,344 B2 | 8/2008 | Yamazaki et al. | |
| 7,619,258 B2 | 11/2009 | Tsuchiya et al. | |
| 7,692,610 B2 | 4/2010 | Kimura | |
| 7,880,380 B2 | 2/2011 | Yamazaki et al. | |
| 7,943,938 B2 | 5/2011 | Miyagi et al. | |
| 7,977,678 B2 | 7/2011 | Yamazaki et al. | |
| RE42,623 E | 8/2011 | Matsueda et al. | |
| 7,994,711 B2 | 8/2011 | Nakamura et al. | |
| 8,188,476 B2 | 5/2012 | Takagi et al. | |
| 8,362,694 B2 | 1/2013 | Hanawa | |
| 8,482,010 B2 | 7/2013 | Kanegae | |
| 8,518,754 B2 | 8/2013 | Takagi et al. | |
| 8,759,835 B2 | 6/2014 | Miyagi et al. | |
| 8,917,016 B2 | 12/2014 | Yamazaki et al. | |
| 9,117,785 B2 | 8/2015 | Kashiwabara et al. | |
| 9,261,722 B2 | 2/2016 | Miyagi et al. | |
| 9,443,876 B2 * | 9/2016 | Yamazaki | H01L 29/7869 |
| 9,887,241 B2 | 2/2018 | Yamazaki et al. | |
| 9,997,542 B2 | 6/2018 | Miyagi et al. | |
| 10,050,098 B2 | 8/2018 | Nam et al. | |
| 10,249,645 B2 | 4/2019 | Yamazaki et al. | |
| 10,345,977 B2 | 7/2019 | Kimura et al. | |
| 10,381,385 B2 | 8/2019 | Miyagi et al. | |
| 10,504,985 B2 | 12/2019 | Nam et al. | |
| 10,811,435 B2 | 10/2020 | Yamazaki et al. | |
| 10,866,682 B2 | 12/2020 | Kimura et al. | |
| 11,107,837 B2 | 8/2021 | Yamazaki et al. | |
| 11,387,263 B2 | 7/2022 | Miyagi et al. | |
| 2008/0272992 A1 * | 11/2008 | Kwak | H10K 59/1315 345/76 |
| 2008/0287028 A1 * | 11/2008 | Ozawa | H10K 71/00 445/24 |
| 2010/0102335 A1 * | 4/2010 | Takagi | H10K 50/824 257/40 |
| 2014/0346459 A1 * | 11/2014 | Song | H10K 50/824 438/34 |
| 2015/0144914 A1 * | 5/2015 | Kashiwabara | H10K 59/131 438/46 |
| 2015/0316802 A1 * | 11/2015 | Takanishi | G02F 1/136227 257/43 |
| 2017/0186831 A1 * | 6/2017 | Nam | H10K 50/814 |
| 2018/0107301 A1 * | 4/2018 | Kimura | G02F 1/134309 |
| 2022/0020781 A1 | 1/2022 | Yamazaki et al. | |

FOREIGN PATENT DOCUMENTS

| | | |
|---|---|---|
| CN | 101728421 A | 6/2010 |
| CN | 102741905 A | 10/2012 |
| CN | 103035665 A | 4/2013 |
| CN | 104821338 A | 8/2015 |
| CN | 107039491 A | 8/2017 |
| EP | 3188274 A | 7/2017 |
| JP | 2005-031645 A | 2/2005 |
| JP | 2005-031651 A | 2/2005 |
| JP | 2006-113597 A | 4/2006 |
| JP | 2009-266451 A | 11/2009 |
| JP | 2010-108693 A | 5/2010 |
| JP | 2014-103424 A | 6/2014 |
| JP | 2015-121764 A | 7/2015 |
| JP | 2017-120782 A | 7/2017 |
| JP | 2018-067308 A | 4/2018 |
| KR | 2010-0047796 A | 5/2010 |
| KR | 2014-0136787 A | 12/2014 |
| KR | 2015-0059588 A | 6/2015 |
| KR | 2017-0078175 A | 7/2017 |
| TW | 201023679 | 6/2010 |

OTHER PUBLICATIONS

Written Opinion (Application No. PCT/IB2019/057029) dated Dec. 3, 2019.

Chinese Office Action (Application No. 201980055083.5) dated Sep. 5, 2022.

* cited by examiner

DISPLAY PANEL, DISPLAY DEVICE, INPUT/OUTPUT DEVICE, AND DATA PROCESSING DEVICE

TECHNICAL FIELD

One embodiment of the present invention relates to a display panel, a display device, an input/output device, a data processing device, or a semiconductor device.

Note that one embodiment of the present invention is not limited to the above technical field. The technical field of one embodiment of the invention disclosed in this specification and the like relates to an object, a method, or a manufacturing method. One embodiment of the present invention relates to a process, a machine, manufacture, or a composition of matter. Thus, more specifically, examples of the technical field of one embodiment of the present invention disclosed in this specification include a semiconductor device, a display device, a light-emitting device, a power storage device, a memory device, a driving method thereof, and a manufacturing method thereof.

BACKGROUND ART

As a manufacturing method of a display device, the following method is known (Patent Document 1). An element substrate and a counter substrate are attached to each other in a vacuum atmosphere with projections therebetween, so that an attached substrate is formed. Then, the attached substrate is extracted to the air while the space between the element substrate and the counter substrate is kept in a vacuum atmosphere. Next, the attached substrate is irradiated with laser light, so that a portion of an organic layer over an auxiliary electrode is removed. Since the space between the element substrate and the counter substrate is kept in a vacuum atmosphere, the portion of the organic layer formed over the auxiliary electrode is irradiated with laser light in a vacuum atmosphere even when the attached substrate is irradiated with laser light after extracted to the air.

PRIOR ART

Patent Document

[Patent Document 1] United States Patent Application Publication No. 2008/0287028

SUMMARY OF THE INVENTION

Problems to be Solved by the Invention

An object of one embodiment of the present invention is to provide a novel display panel that is highly convenient or reliable. Alternatively, an object is to provide a novel display device that is highly convenient or reliable. Alternatively, an object is to provide a novel input/output device that is highly convenient or reliable. Alternatively, an object is to provide a novel data processing device that is highly convenient or reliable. Alternatively, an object is to provide a novel display panel, a novel display device, a novel input/output device, a novel data processing device, or a novel semiconductor device.

Note that the descriptions of these objects do not preclude the existence of other objects. One embodiment of the present invention does not have to achieve all these objects. Objects other than these will be apparent from the descriptions of the specification, the drawings, the claims, and the like, and objects other than these can be derived from the descriptions of the specification, the drawings, the claims, and the like.

Means for Solving the Problems (1) One embodiment of the present invention is a display panel including a display region, a functional layer, a first insulating film, and a first conductive film.

The display region includes a pixel, and the pixel includes a display element and a pixel circuit.

The display element includes a region sandwiched between the first insulating film and the functional layer, and the display element includes a first electrode and a second electrode. The first electrode includes a region sandwiched between the second electrode and the functional layer, and the second electrode includes a first opening portion.

The functional layer includes a pixel circuit, a second opening portion, and an auxiliary wiring.

The pixel circuit is electrically connected to the display element in the second opening portion, and the auxiliary wiring includes a region overlapping with the first opening portion.

The first insulating film includes a third opening portion, and the third opening portion includes a region overlapping with the first opening portion.

The first conductive film is electrically connected to the second electrode and the auxiliary wiring in the third opening portion.

Thus, the auxiliary wiring can be electrically connected to the second electrode through the first conductive film. As a result, a novel display panel that is highly convenient or reliable can be provided.

(2) Another embodiment of the present invention is the display panel in which the first insulating film includes a region sandwiched between the first conductive film and the second electrode.

Thus, the first insulating film can inhibit diffusion of impurities into the display element. As a result, a novel display panel that is highly convenient or reliable can be provided.

(3) Another embodiment of the present invention is the display panel in which the first conductive film has a light-transmitting property and the second electrode has a light-transmitting property.

Thus, light emitted from the display element can be extracted from the first conductive film side. As a result, a novel display panel that is highly convenient or reliable can be provided.

(4) Another embodiment of the present invention is the display panel further including a second insulating film.

The first conductive film includes a region sandwiched between the second insulating film and the auxiliary wiring, and the second insulating film has a light-transmitting property.

Thus, the second insulating film can inhibit diffusion of impurities into the display element. Alternatively, diffusion of impurities from the opening portion into the display element can be inhibited. As a result, a novel display panel that is highly convenient or reliable can be provided.

(5) Another embodiment of the present invention is the display panel in which the first opening portion has a smaller area than the third opening portion.

The first conductive film is electrically connected to the second electrode at a peripheral edge of the first opening portion.

Thus, a contact area between the first conductive film and the second electrode can be increased. As a result, a novel display panel that is highly convenient or reliable can be provided.

(6) Another embodiment of the present invention is the display panel in which the first electrode includes a second conductive film and the auxiliary wiring contains the same material as the second conductive film.

Thus, the auxiliary wiring can be formed in a step of forming the first electrode. As a result, a novel display panel that is highly convenient or reliable can be provided.

(7) Another embodiment of the present invention is the display panel in which the display region includes a group of pixels, another group of pixels, a scan line, and a signal line.

The group of pixels is arranged in a row direction, and the group of pixels includes the pixel.

The another group of pixels is arranged in a column direction intersecting the row direction, and the another group of pixels includes the pixel.

The scan line is electrically connected to the group of pixels, and the signal line is electrically connected to the another group of pixels.

Thus, image data can be supplied to a plurality of pixels. As a result, a novel display panel that is highly convenient or reliable can be provided.

(8) Another embodiment of the present invention is a display device including the above display panel and a control portion.

The control portion is supplied with image data and control data, the control portion generates data on the basis of the image data, and the control portion generates a control signal on the basis of the control data. The control portion supplies the data and the control signal.

The display panel is supplied with the data and the control signal, and the pixel performs display on the basis of the data.

Thus, the image data can be displayed using the display element. As a result, a novel display device that is highly convenient or reliable can be provided.

(9) Another embodiment of the present invention is an input/output device including an input portion and a display portion.

The display portion includes the above display panel.

The input portion includes a sensing region, the input portion senses an object approaching the sensing region, and the sensing region includes a region overlapping with the pixel.

Thus, the object approaching the region overlapping with the display portion can be sensed while image data is displayed using the display portion. Alternatively, a finger or the like that approaches the display portion can be used as a pointer to input positional data. Alternatively, positional data can be associated with image data displayed on the display portion. As a result, a novel input/output device that is highly convenient or reliable can be provided.

(10) Another embodiment of the present invention is a data processing device including an arithmetic device and an input/output device.

The arithmetic device is supplied with input data or sensing data, the arithmetic device generates control data and image data on the basis of the input data or the sensing data, and the arithmetic device supplies the control data and the image data.

The input/output device supplies the input data and the sensing data, the input/output device is supplied with the control data and the image data, and the input/output device includes a display portion, an input portion, and a sensing portion.

The display portion includes the above display panel, and the display portion displays the image data on the basis of the control data.

The input portion generates the input data, and the sensing portion generates the sensing data.

Thus, the control data can be generated on the basis of the input data or the sensing data. Alternatively, the image data can be displayed on the basis of the input data or the sensing data. As a result, a novel data processing device that is highly convenient or reliable can be provided.

(11) Another embodiment of the present invention is a data processing device including one or more of a keyboard, a hardware button, a pointing device, a touch sensor, an illuminance sensor, an imaging device, an audio input device, an eye-gaze input device, and an attitude detection device, and the above display panel.

Thus, the arithmetic device can generate the image data or the control data on the basis of the data supplied using a variety of input devices. As a result, a novel data processing device that is highly convenient or reliable can be provided.

Although the block diagram in which components are classified by their functions and shown as independent blocks is shown in the drawings attached to this specification, it is difficult to completely separate actual components according to their functions and one component can relate to a plurality of functions.

In this specification, the names of a source and a drain of a transistor interchange with each other depending on the polarity of the transistor and the levels of potentials applied to the terminals. In general, in an n-channel transistor, a terminal to which a lower potential is applied is called a source, and a terminal to which a higher potential is applied is called a drain. In a p-channel transistor, a terminal to which a lower potential is applied is called a drain, and a terminal to which a higher potential is applied is called a source. In this specification, for the sake of convenience, the connection relation of a transistor is sometimes described assuming that the source and the drain are fixed; in reality, the names of the source and the drain interchange with each other according to the above relation of the potentials.

In this specification, a source of a transistor means a source region that is part of a semiconductor film functioning as an active layer or a source electrode connected to the above semiconductor film. Similarly, a drain of a transistor means a drain region that is part of the above semiconductor film or a drain electrode connected to the above semiconductor film. Moreover, a gate means a gate electrode.

In this specification, a state in which transistors are connected in series means, for example, a state in which only one of a source and a drain of a first transistor is connected to only one of a source and a drain of a second transistor. In addition, a state in which transistors are connected in parallel means a state in which one of a source and a drain of a first transistor is connected to one of a source and a drain of a second transistor and the other of the source and the drain of the first transistor is connected to the other of the source and the drain of the second transistor.

In this specification, connection means electrical connection and corresponds to a state in which a current, a voltage, or a potential can be supplied or transmitted. Accordingly, a state of being connected does not necessarily mean a state of being directly connected and also includes, in its category, a state of being indirectly connected through a circuit element such as a wiring, a resistor, a diode, or a transistor that allows a current, a voltage, or a potential to be supplied or transmitted.

In this specification, even when independent components are connected to each other in a circuit diagram, there is actually a case where one conductive film has functions of a plurality of components, such as a case where part of a wiring functions as an electrode, for example. Connection in this specification also includes such a case where one conductive film has functions of a plurality of components, in its category.

Furthermore, in this specification, one of a first electrode and a second electrode of a transistor refers to a source electrode and the other refers to a drain electrode.

Effect of the Invention

According to one embodiment of the present invention, a novel display panel that is highly convenient or reliable can be provided. Alternatively, a novel display device that is highly convenient or reliable can be provided. Alternatively, a novel input/output device that is highly convenient or reliable can be provided. Alternatively, a novel data processing device that is highly convenient or reliable can be provided. Alternatively, a novel display panel, a novel display device, a novel input/output device, a novel data processing device, or a novel semiconductor device can be provided.

Note that the descriptions of the effects do not preclude the existence of other effects. Note that one embodiment of the present invention does not need to have all these effects. Effects other than these will be apparent from the descriptions of the specification, the drawings, the claims, and the like, and effects other than these can be derived from the descriptions of the specification, the drawings, the claims, and the like.

BRIEF DESCRIPTION OF THE DRAWINGS

FIG. 12A and FIG. 12B1 to FIG. 12B3 are diagrams illustrating structures of a display device of one embodiment.

MODE FOR CARRYING OUT THE INVENTION

Figure 1A:
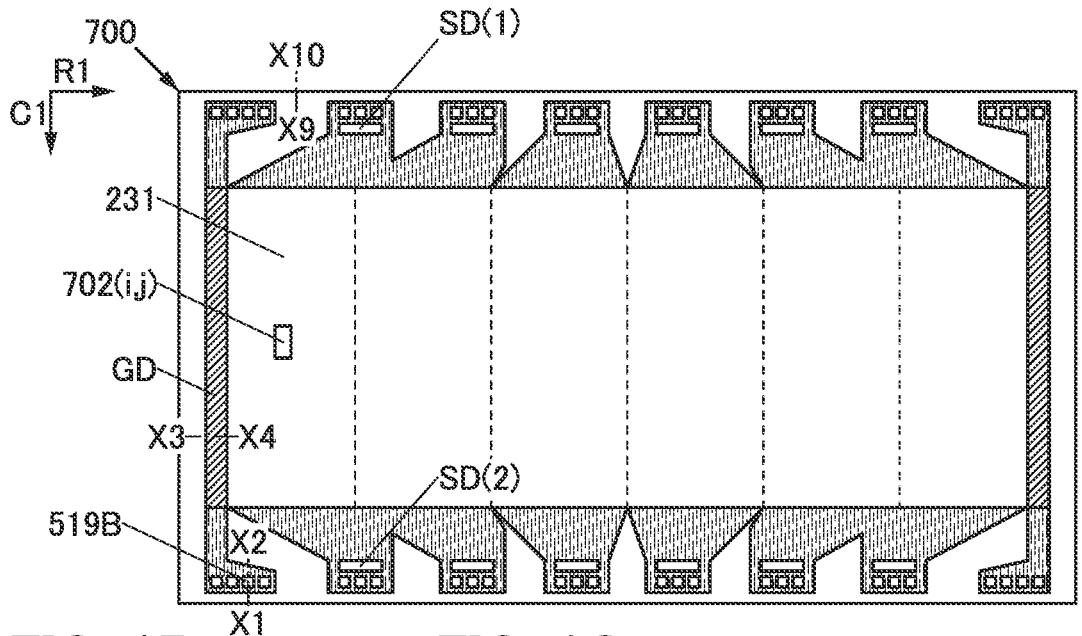
FIG. 1A to FIG. 1E are diagrams illustrating structures of a display panel of one embodiment.
Figure 1B:
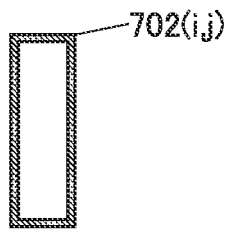

A display panel of one embodiment of the present invention includes a display region, a functional layer, a first insulating film, and a first conductive film. The display region includes a pixel, and the pixel includes a display element and a pixel circuit. The display element includes a region sandwiched between the first insulating film and the functional layer, the display element includes a first electrode and a second electrode, the first electrode includes a region sandwiched between the second electrode and the functional layer, and the second electrode includes a first opening portion. The functional layer includes the pixel circuit, a second opening portion, and an auxiliary wiring; the pixel circuit is electrically connected to the display element in the second opening portion; and the auxiliary wiring includes a region overlapping with the first opening portion. The first insulating film includes a third opening portion, and the third opening portion includes a region overlapping with the first opening portion. The first conductive film is electrically connected to the second electrode and the auxiliary wiring in the third opening portion.

Thus, the auxiliary wiring can be electrically connected to the second electrode through the first conductive film. As a result, a novel display panel that is highly convenient or reliable can be provided.

Embodiments are described in detail with reference to the drawings. Note that the present invention is not limited to the following descriptions, and it will be readily appreciated by those skilled in the art that modes and details of the present invention can be modified in various ways without departing from the spirit and scope of the present invention. Thus, the present invention should not be construed as being limited to the descriptions in the following embodiments. Note that in structures of the present invention described below, the same portions or portions having similar functions are denoted by the same reference numerals in different drawings, and a description thereof is not repeated.

Embodiment 1

In this embodiment, structures of a display panel of one embodiment of the present invention will be described with reference to FIG. 1 to FIG. 5.

FIG. 1 illustrates structures of the display panel of one embodiment of the present invention. FIG. 1A is a top view of the display panel of one embodiment of the present invention. FIG. 1B and FIG. 1C are each a diagram illustrating part of FIG. 1A. FIG. 1D and FIG. 1E are diagrams illustrating a structure different from that in FIG. 1B and FIG. 1C.

Figure 2A:
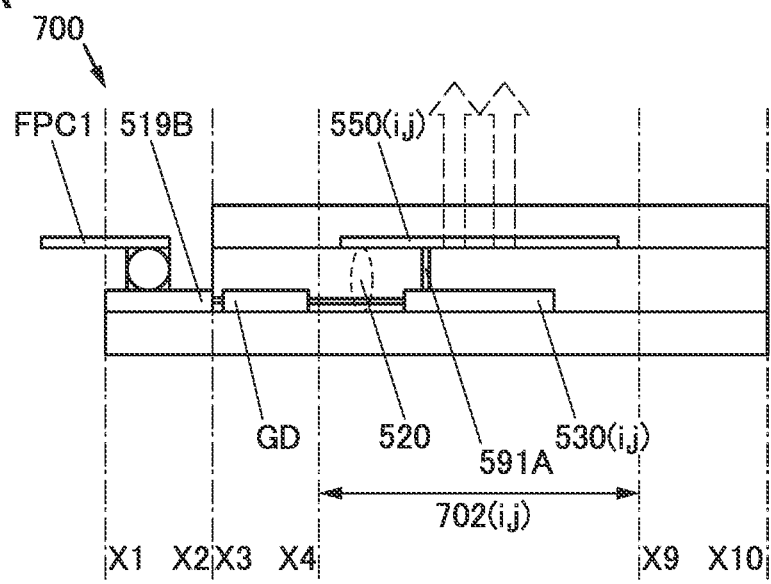
FIGS. 2A and 2B are diagrams illustrating a structure of a display panel of one embodiment.
Figure 2B:
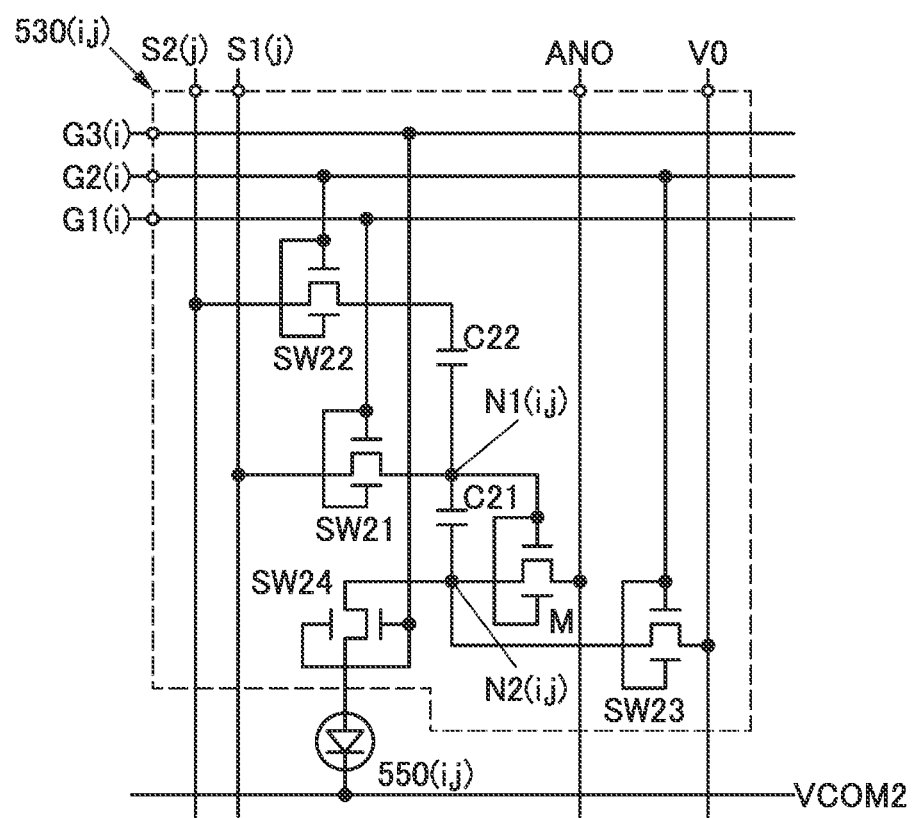

FIG. 2 illustrates a structure of the display panel of one embodiment of the present invention. FIG. 2A is a cross-sectional view taken along cutting lines X1-X2, X3-X4, and X9-X10 and of a pixel in FIG. 1A, and FIG. 2B is a circuit diagram illustrating a configuration of a pixel circuit 530(i, j).

Figure 3A:
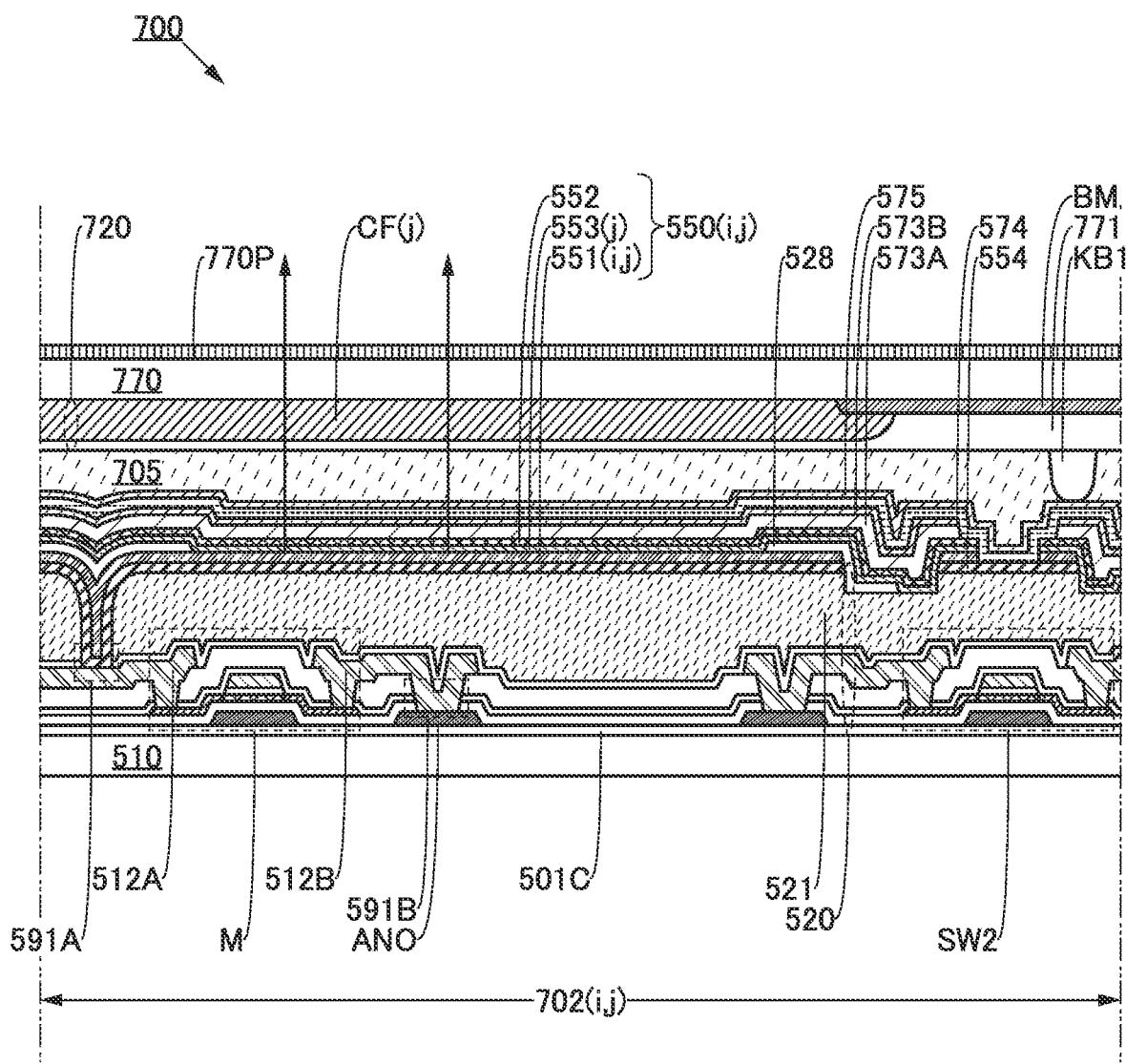
FIG. 3A and FIG. 3B are cross-sectional views illustrating a structure of a display panel of one embodiment.
Figure 3B:
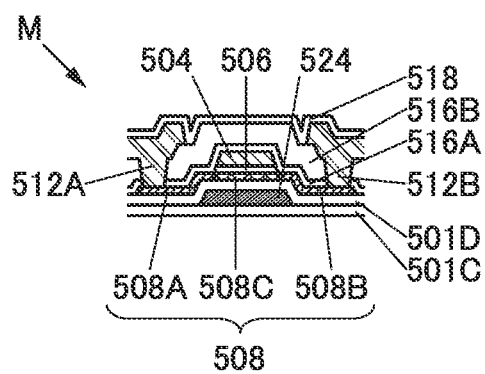

FIG. 3 illustrates a structure of the display panel of one embodiment of the present invention. FIG. 3A is a cross-sectional view of a pixel 702(i,j) in FIG. 1A, and FIG. 3B is a cross-sectional view illustrating part of FIG. 3A.

Figure 4A:
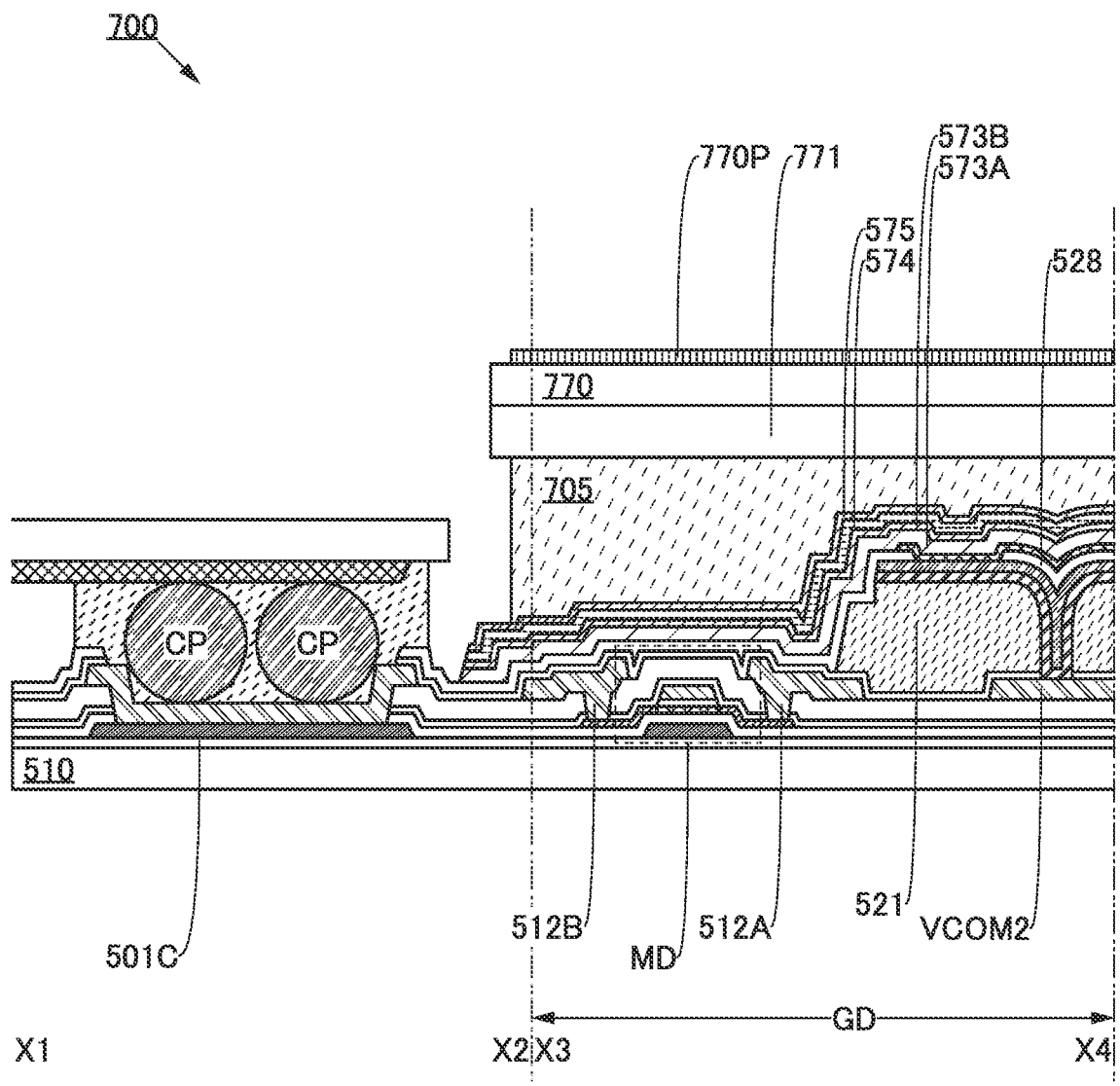
FIG. 4A and FIG. 4B are cross-sectional views illustrating a structure of a display panel of one embodiment.
Figure 4B:
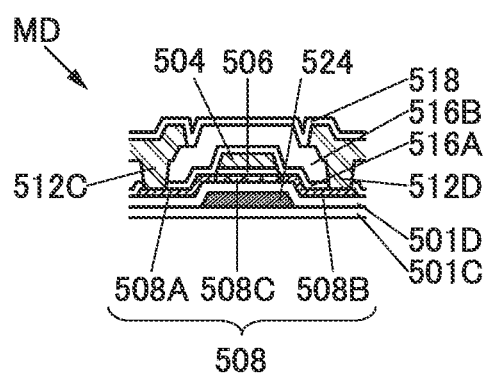

FIG. 4 illustrates a structure of the display panel of one embodiment of the present invention. FIG. 4A is a cross-sectional view taken along cutting lines X1-X2 and X3-X4 in FIG. 1A, and FIG. 4B is a cross-sectional view illustrating part of FIG. 4A.

Figure 5A:
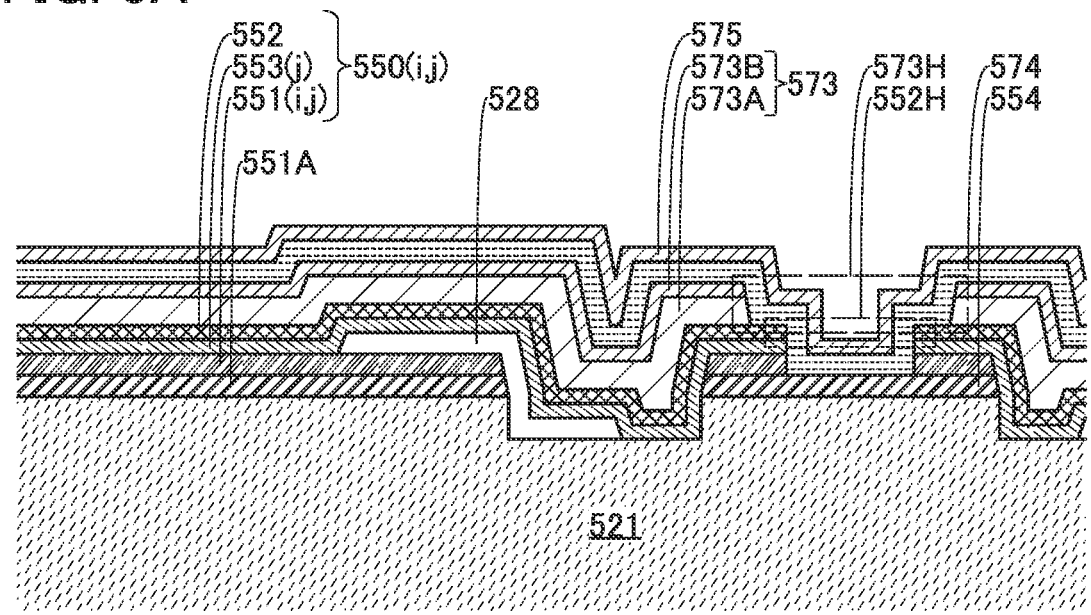
FIG. 5A to FIG. 5C are diagrams each illustrating a structure of a display panel of one embodiment.
Figure 5B:
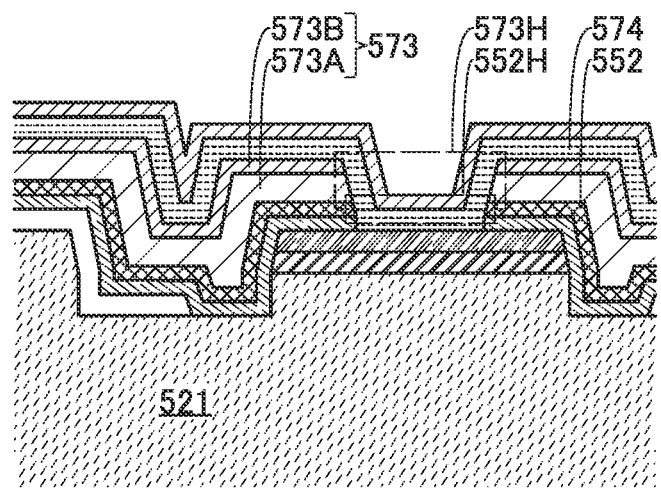
Figure 5C:
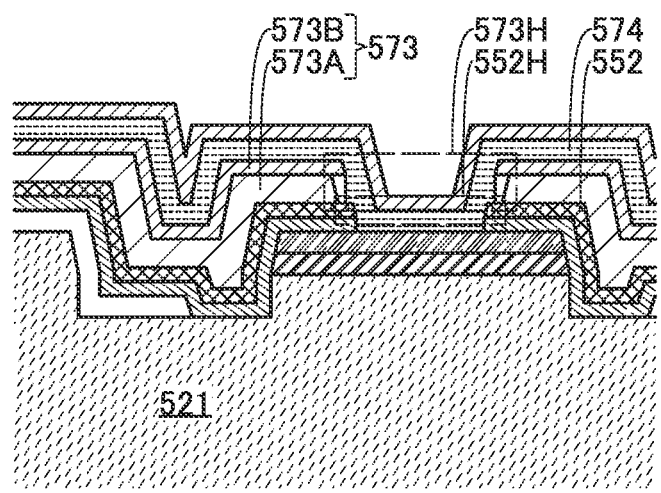

FIG. 5 illustrates a structure of the display panel of one embodiment of the present invention. FIG. 5A is a cross-sectional view illustrating part of FIG. 3A, and FIG. 5B and FIG. 5C are each a cross-sectional view illustrating a structure different from that in FIG. 5A.

Note that in this specification, an integer variable of 1 or more is sometimes used in reference numerals. For example, (p) where p is an integer variable of 1 or more is sometimes used in part of a reference numeral that specifies any of p components at a maximum. For another example, (m,n) where m and n are each an integer variable of 1 or more is sometimes used in part of a reference numeral that specifies any of m×n components at a maximum.

Structure Example 1 of Display Panel 700

The display panel described in this embodiment includes a display region 231, a functional layer 520, an insulating film 573, and a conductive film 574 (see FIG. 1A and FIG. 3A).

The display region 231 includes the pixel 702(i,j), and the pixel 702(i,j) includes a display element 550(i,j) and the pixel circuit 530(i,j) (see FIG. 1A and FIG. 2A).

Structure Example 1 of Display Element 550(i,j)

The display element 550(i,j) includes a region sandwiched between the insulating film 573 and the functional layer 520 (see FIG. 3A and FIG. 5A).

The display element 550(i,j) includes an electrode 551(i,j) and an electrode 552.

Structure Example 1 of Electrode 551(i,j)

The electrode 551(i,j) includes a region sandwiched between the electrode 552 and the functional layer 520.
<<Electrode 552>>
The electrode 552 includes an opening portion 552H (see FIG. 5A). Note that a material having a light-transmitting property can be used for the electrode 552.

Structure Example 1 of Functional Layer 520

The functional layer 520 includes the pixel circuit 530(i,j), an opening portion 591A, and an auxiliary wiring 554 (see FIG. 3A and FIG. 5A).

The pixel circuit 530(i,j) is electrically connected to the display element 550(i,j) in the opening portion 591A (see FIG. 2A).

Structure Example 1 of Auxiliary Wiring 554

The auxiliary wiring 554 includes a region overlapping with the opening portion 552H (see FIG. 5).

Structure Example 1 of Insulating Film 573

The insulating film 573 includes an opening portion 573H. The opening portion 573H includes a region overlapping with the opening portion 552H.

Structure Example 1 of Conductive Film 574

The conductive film 574 is electrically connected to the electrode 552 and the auxiliary wiring 554 in the opening portion 573H.

Thus, the auxiliary wiring 554 can be electrically connected to the electrode 552 through the conductive film 574. Alternatively, the pixel circuit 530(i,j) can be formed in the functional layer 520. Alternatively, the display element 550(i,j) can be driven with the use of the pixel circuit 530(i,j). As a result, a novel display panel that is highly convenient or reliable can be provided.

Structure Example 2 of Insulating Film 573

The insulating film 573 includes a region sandwiched between the conductive film 574 and the electrode 552 (see FIG. 3A and FIG. 5A). In addition, the insulating film 573 includes a region; between the region and the functional layer 520, the display element 550(i,j) is sandwiched. Note that a material having a light-transmitting property can be used for the insulating film 573.

For example, a single film or a stacked film in which a plurality of films are stacked can be used as the insulating film 573. Specifically, a stacked film in which an insulating film 573A formed by a method that hardly damages the display element 550(i,j) and a dense insulating film 573B with a few defects are stacked can be used as the insulating film 573. For example, a film containing nitrogen and silicon or a film containing oxygen and silicon can be used as the insulating film 573. Alternatively, a stack of a low-density insulating film and a high-density insulating film can be used as the insulating film 573.

Thus, the insulating film 573 can inhibit diffusion of impurities into the display element 550(i,j). As a result, a novel display panel that is highly convenient or reliable can be provided.

Structure Example 2 of Display Panel 700

The display panel described in this embodiment includes an insulating film 575.

Structure Example 2 of Conductive Film 574

The conductive film 574 includes a region sandwiched between the insulating film 575 and the auxiliary wiring 554. Note that a material having a light-transmitting property can be used for the conductive film 574.

Structure Example of Insulating Film 575

The insulating film 575 has a light-transmitting property. For example, a film containing nitrogen and silicon, a film containing oxygen and silicon, or a film containing oxygen and aluminum can be used as the insulating film 575.

Thus, the insulating film 575 can inhibit diffusion of impurities into the display element 550(i,j). Alternatively, diffusion of impurities into the display element 550(i,j) through the opening portion 573H can be inhibited. As a result, a novel display panel that is highly convenient or reliable can be provided.

Structure Example 1 of Opening Portion 552H

The opening portion 552H has a smaller area than the opening portion 573H (see FIG. 3A and FIG. 5A). In other words, the electrode 552 includes a region protruding into the opening portion 573H.

Structure Example 3 of Conductive Film 574

The conductive film 574 is electrically connected to the electrode 552 at a peripheral edge of the opening portion 552H. In other words, the conductive film 574 is electrically connected to the electrode 552 protruding into the opening portion 573H.

Accordingly, the contact area between the conductive film 574 and the electrode 552 can be increased. As a result, a novel display panel that is highly convenient or reliable can be provided.

Structure Example 2 of Opening Portion 552H

The opening portion 552H can have substantially the same area as the opening portion 573H (see FIG. 5B). In this case, the conductive film 574 is electrically connected to an end surface of the electrode 552.

Structure Example 3 of Insulating Film 573

Furthermore, an insulating film having a larger opening portion than the insulating film 573B and in contact with the electrode 552 can be used as the insulating film 573A (see FIG. 5C). For example, the opening portion 573H is formed using a gas that etches the insulating film 573A more than the insulating film 573B. Accordingly, the contact area between the conductive film 574 and the electrode 552 can be increased.

Structure Example 2 of Electrode 551(i,j)

The electrode 551(i,j) includes a conductive film 551A. A film that efficiently reflects light can be used as the conductive film 551A, for example. Furthermore, a stacked film in which a light-transmitting conductive film is stacked over the conductive film 551A can be used as the electrode 551(i,j).

Structure Example 2 of Auxiliary Wiring 554

The auxiliary wiring 554 contains the same material as the conductive film 551A. For example, a conductive film that can be formed in a step of forming part of the electrode 551(i,j) can be used as the auxiliary wiring 554.

Thus, the auxiliary wiring 554 can be formed in the step of forming the electrode 551(i,j). In addition, the fabrication process of the display panel can be simplified. As a result, a novel display panel that is highly convenient or reliable can be provided.

Configuration Example 1 of Pixel Circuit 530(i,j)

The pixel circuit 530(i,j) is electrically connected to a scan line G1(i) and a signal line S1(j) (see FIG. 2B).

A switch, a transistor, a diode, a resistor, an inductor, a capacitor, or the like can be used in the pixel circuit 530(i,j), for example. Specifically, a transistor can be used as a switch.

For example, in the case where a plurality of transistors are used in a pixel circuit, a semiconductor film of one transistor can be formed in the step of forming a semiconductor film of another transistor.

Configuration Example 2 of Pixel Circuit 530(i,j)

The pixel circuit 530(i,j) includes a transistor M, a capacitor C21, a switch SW21, a node N1(i,j), a capacitor C22, and a switch SW22. The pixel circuit 530(i,j) also includes a node N2(i,j), a switch SW23, and a switch SW24.

The transistor M includes a first electrode electrically connected to a conductive film ANO.

The capacitor C21 includes a first electrode electrically connected to a gate electrode of the transistor M and a second electrode electrically connected to a second electrode of the transistor M.

The switch SW21 includes a first terminal supplied with a first signal and includes a second terminal electrically connected to the gate electrode of the transistor M. Note that the switch SW21 has a function of switching a conduction state and a non-conduction state on the basis of a selection signal.

The capacitor C22 includes a first electrode electrically connected to the gate electrode of the transistor M.

The switch SW22 includes a first terminal supplied with a second signal, and includes a second terminal electrically connected to a second electrode of the capacitor C22. Note that the switch SW22 has a function of switching a conduction state and a non-conduction state on the basis of a second selection signal.

The switch SW23 includes a first terminal electrically connected to the second electrode of the transistor M and a second terminal electrically connected to a conductive film VO. Note that the switch SW23 has a function of switching a conduction state and a non-conduction state on the basis of the second selection signal.

The switch SW24 includes a first terminal electrically connected to the second electrode of the transistor M and a second terminal electrically connected to the display element 550(i,j). Note that the switch SW24 has a function of switching a conduction state and a non-conduction state on the basis of a third selection signal.

Note that the switch SW22 can be brought into a conduction state when the switch SW21 changes from a conduction state to a non-conduction state.

In addition, when the switch SW21 is in a non-conduction state, the switch SW22 can be changed from a non-conduction state to a conduction state, or the switch SW22 can be changed from a conduction state to a non-conduction state.

The display element 550(i,j) performs display on the basis of a potential VN of the node N1(i,j).

Thus, a potential of the node N1(i,j) can be controlled using the switch SW21 and the switch SW22. Alternatively, the potential of the node N1(i,j) can be controlled using the switch SW21, and the potential of the node N1(i,j) can be changed using the switch SW22. Alternatively, the changing potential can be supplied to the display element 550(i,j). Alternatively, display can be performed on the basis of the changing potential. Alternatively, the display of the display element 550(i,j) can be changed. Alternatively, an operation of the display element 550(i,j) can be emphasized. Alternatively, the response of the display element 550(i,j) can be made faster. As a result, a novel display panel that is highly convenient or reliable can be provided.

Structure Example of Transistor

A bottom-gate transistor or a top-gate transistor can be used in the pixel circuit 530($i,j$), for example.

The transistor includes a semiconductor film 508, a conductive film 504, a conductive film 512A, and a conductive film 512B (see FIG. 3B).

The semiconductor film 508 includes a region 508A electrically connected to the conductive film 512A and a region 508B electrically connected to the conductive film 512B. The semiconductor film 508 includes a region 508C between the region 508A and the region 508B.

The conductive film 504 includes a region overlapping with the region 508C, and the conductive film 504 has a function of a gate electrode.

An insulating film 506 includes a region sandwiched between the semiconductor film 508 and the conductive film 504. The insulating film 506 has a function of a gate insulating film.

The conductive film 512A has one of a function of a source electrode and a function of a drain electrode, and the conductive film 512B has the other of the function of the source electrode and the function of the drain electrode.

A conductive film 524 can be used for the transistor. The conductive film 524 includes a region; between the region and the conductive film 504, the semiconductor film 508 is sandwiched. The conductive film 524 has a function of a second gate electrode. The conductive film 524 can be electrically connected to the conductive film 504, for example. Note that a conductive film that can be formed in the step of forming the conductive film 524 can be used as the scan line G1($i$).

Note that in a process of forming the semiconductor film used in the transistor of the pixel circuit, the semiconductor film used in the transistor of the driver circuit can be formed.

Structure Example 1 of Semiconductor Film 508

A semiconductor containing a Group 14 element can be used for the semiconductor film 508, for example. Specifically, a semiconductor containing silicon can be used for the semiconductor film 508.

[Hydrogenated Amorphous Silicon]

For example, hydrogenated amorphous silicon can be used for the semiconductor film 508. Alternatively, microcrystalline silicon or the like can be used for the semiconductor film 508. Thus, a display panel having less display unevenness than a display panel using polysilicon for the semiconductor film 508, for example, can be provided. Alternatively, the size of the display panel can be easily increased.

[Polysilicon]

For example, polysilicon can be used for the semiconductor film 508. In this case, for example, the field-effect mobility of the transistor can be higher than that of a transistor using hydrogenated amorphous silicon for the semiconductor film 508. Alternatively, for example, the driving capability can be higher than that of a transistor using hydrogenated amorphous silicon for the semiconductor film 508. Alternatively, for example, the aperture ratio of the pixel can be higher than that of a transistor using hydrogenated amorphous silicon for the semiconductor film 508.

Alternatively, for example, the reliability of the transistor can be higher than that of a transistor using hydrogenated amorphous silicon for the semiconductor film 508.

Alternatively, the temperature required for fabrication of the transistor can be lower than that required for a transistor using single crystal silicon, for example.

Alternatively, the semiconductor film used for the transistor in the driver circuit can be formed through the same process as the semiconductor film used for the transistor in the pixel circuit. Alternatively, the driver circuit can be formed over the same substrate where the pixel circuit is formed. Alternatively, the number of components included in an electronic device can be reduced.

[Single Crystal Silicon]

For example, single crystal silicon can be used for the semiconductor film 508. In this case, for example, the resolution can be higher than that of a display panel using hydrogenated amorphous silicon for the semiconductor film 508. Alternatively, for example, a display panel having less display unevenness than a display panel using polysilicon for the semiconductor film 508 can be provided. Alternatively, for example, smart glasses or a head mounted display having less display unevenness can be provided.

Structure Example 2 of Semiconductor Film 508

For example, a metal oxide can be used for the semiconductor film 508. Thus, a pixel circuit can hold an image signal for a longer time than a pixel circuit utilizing a transistor using amorphous silicon for a semiconductor film. Specifically, a selection signal can be supplied at a frequency of lower than 30 Hz, preferably lower than 1 Hz, further preferably less than once per minute with the suppressed occurrence of flickers. Consequently, fatigue accumulation in a user of a data processing device can be reduced. Moreover, power consumption for driving can be reduced.

A transistor using an oxide semiconductor can be used, for example. Specifically, an oxide semiconductor containing indium or an oxide semiconductor containing indium, gallium, and zinc can be used for the semiconductor film.

A transistor having a lower leakage current in an off state than a transistor using amorphous silicon for a semiconductor film can be used, for example. Specifically, a transistor using an oxide semiconductor for a semiconductor film can be used.

A 25-nm-thick film containing indium, gallium, and zinc can be used as the semiconductor film 508, for example.

A conductive film in which a 10-nm-thick film containing tantalum and nitrogen and a 300-nm-thick film containing copper are stacked can be used as the conductive film 504, for example. Note that the film containing copper includes a region; between the region and the insulating film 506, the film containing tantalum and nitrogen is sandwiched.

A stacked film in which a 400-nm-thick film containing silicon and nitrogen and a 200-nm-thick film containing silicon, oxygen, and nitrogen are stacked can be used as the insulating film 506, for example. Note that the film containing silicon and nitrogen includes a region; between the region and the semiconductor film 508, the film containing silicon, oxygen, and nitrogen is sandwiched.

A conductive film in which a 50-nm-thick film containing tungsten, a 400-nm-thick film containing aluminum, and a 100-nm-thick film containing titanium are stacked in this order can be used as the conductive film 512A or the conductive film 512B, for example. Note that the film containing tungsten includes a region in contact with the semiconductor film 508.

A manufacturing line for a bottom-gate transistor using amorphous silicon as a semiconductor can be easily remodeled into a manufacturing line for a bottom-gate transistor using an oxide semiconductor as a semiconductor, for example. Furthermore, a manufacturing line for a top-gate transistor using polysilicon as a semiconductor can be easily remodeled into a manufacturing line for a top-gate transistor using an oxide semiconductor as a semiconductor, for example. In either remodeling, an existing manufacturing line can be effectively utilized.

Accordingly, flickering can be suppressed. Alternatively, the power consumption can be reduced. Alternatively, a moving image with quick movements can be smoothly displayed. Alternatively, a photograph and the like can be displayed with a wide range of grayscale. As a result, a novel display panel that is highly convenient or reliable can be provided.

Structure Example 3 of Semiconductor Film 508

For example, a compound semiconductor can be used as the semiconductor of the transistor. Specifically, a semiconductor containing gallium arsenide can be used.

For example, an organic semiconductor can be used as the semiconductor of the transistor. Specifically, an organic semiconductor containing any of polyacenes or graphene can be used for the semiconductor film.

Structure Example 1 of Capacitor

The capacitor C21 includes a plurality of conductive films and an insulating film. One conductive film overlaps with the other conductive film, and the insulating film includes a region sandwiched between the conductive films.

For example, the conductive film 504, the conductive film 512A, and the insulating film 506 can be used in the capacitor.

Structure Example 2 of Functional Layer 520

The functional layer 520 includes an insulating film 521, an insulating film 518, an insulating film 516, the insulating film 506, an insulating film 501C, and the like (see FIG. 3A).

The insulating film 521 includes a region sandwiched between the pixel circuit 530(i,j) and the display element 550(i,j).

The insulating film 518 includes a region sandwiched between the insulating film 521 and the insulating film 501C.

The insulating film 516 includes a region sandwiched between the insulating film 518 and the insulating film 501C.

The insulating film 506 includes a region sandwiched between the insulating film 516 and the insulating film 501C.

[Insulating Film 521]

An insulating inorganic material, an insulating organic material, or an insulating composite material containing an inorganic material and an organic material, for example, can be used for the insulating film 521.

Specifically, an inorganic oxide film, an inorganic nitride film, an inorganic oxynitride film, or the like, or a stacked-layer material in which a plurality of films selected from these films are stacked can be used as the insulating film 521.

For example, a film including a silicon oxide film, a silicon nitride film, a silicon oxynitride film, an aluminum oxide film, or the like, or a film including a stacked-layer material in which a plurality of films selected from these films are stacked can be used as the insulating film 521. Note that the silicon nitride film is a dense film and has an excellent function of inhibiting diffusion of impurities.

For example, for the insulating film 521, polyester, polyolefin, polyamide, polyimide, polycarbonate, polysiloxane, an acrylic resin, or the like, or a stacked-layer material, a composite material, or the like of a plurality of resins selected from these resins can be used. Alternatively, a photosensitive material may be used. Thus, the insulating film 521 can planarize a level difference due to various components overlapping with the insulating film 521, for example.

Note that polyimide is excellent in thermal stability, insulating property, toughness, low dielectric constant, low coefficient of thermal expansion, chemical resistance, and other properties compared with other organic materials. Accordingly, in particular, polyimide can be suitably used for the insulating film 521 or the like.

For example, a film formed using a photosensitive material can be used as the insulating film 521. Specifically, a film formed using photosensitive polyimide, a photosensitive acrylic resin, or the like can be used as the insulating film 521.

[Insulating Film 518]

The material that can be used for the insulating film 521, for example, can be used for the insulating film 518.

For example, a material that has a function of inhibiting diffusion of oxygen, hydrogen, water, an alkali metal, an alkaline earth metal, and the like can be used for the insulating film 518. Specifically, a nitride insulating film can be used as the insulating film 518. For example, silicon nitride, silicon nitride oxide, aluminum nitride, aluminum nitride oxide, or the like can be used for the insulating film 518. Thus, diffusion of impurities into the semiconductor film of the transistor can be inhibited.

[Insulating Film 516]

The material that can be used for the insulating film 521, for example, can be used for the insulating film 516.

Specifically, a film formed by a fabrication method different from that of the insulating film 518 can be used as the insulating film 516.

[Insulating Film 506]

The material that can be used for the insulating film 521, for example, can be used for the insulating film 506.

Specifically, a silicon oxide film, a silicon oxynitride film, a silicon nitride oxide film, a silicon nitride film, an aluminum oxide film, a hafnium oxide film, an yttrium oxide film, a zirconium oxide film, a gallium oxide film, a tantalum oxide film, a magnesium oxide film, a lanthanum oxide film, a cerium oxide film, or a neodymium oxide film can be used as the insulating film 506.

[Insulating Film 501D]

An insulating film 501D includes a region sandwiched between the insulating film 501C and the insulating film 516.

The material that can be used for the insulating film 506, for example, can be used for the insulating film 501D.

[Insulating Film 501C]

The material that can be used for the insulating film 521, for example, can be used for the insulating film 501C. Specifically, a material containing silicon and oxygen can be used for the insulating film 501C. Thus, diffusion of impurities into the pixel circuit, the display element, or the like can be inhibited.

Structure Example 3 of Functional Layer 520

The functional layer 520 includes a conductive film, a wiring, and a terminal. A material having conductivity can be used for the wiring, an electrode, the terminal, the conductive film, or the like.

<<Wiring or the Like>>

For example, an inorganic conductive material, an organic conductive material, a metal, a conductive ceramic, or the like can be used for the wiring or the like.

Specifically, a metal element selected from aluminum, gold, platinum, silver, copper, chromium, tantalum, titanium, molybdenum, tungsten, nickel, iron, cobalt, palladium, and manganese, or the like can be used for the wiring or the like. Alternatively, an alloy containing the above-described metal element, or the like can be used for the wiring or the like. In particular, an alloy of copper and manganese is suitable for microfabrication using a wet etching method.

Specifically, a two-layer structure in which a titanium film is stacked over an aluminum film, a two-layer structure in which a titanium film is stacked over a titanium nitride film, a two-layer structure in which a tungsten film is stacked over a titanium nitride film, a two-layer structure in which a tungsten film is stacked over a tantalum nitride film or a tungsten nitride film, a three-layer structure of a titanium film, an aluminum film stacked over the titanium film, and a titanium film further formed thereover, or the like can be used for the wiring or the like.

Specifically, a conductive oxide such as indium oxide, indium tin oxide, indium zinc oxide, zinc oxide, or zinc oxide to which gallium is added can be used for the wiring or the like.

Specifically, a film containing graphene or graphite can be used for the wiring or the like.

For example, a film containing graphene oxide is formed and the film containing graphene oxide is reduced, so that a film containing graphene can be formed. As a reducing method, a method with application of heat, a method using a reducing agent, or the like can be given.

For example, a film including a metal nanowire can be used for the wiring or the like. Specifically, a nanowire containing silver can be used.

Specifically, a conductive high molecule can be used for the wiring or the like.

Note that a terminal 519B can be electrically connected to a flexible printed circuit FPC1 using a conductive material, for example (see FIG. 2A). Specifically, the terminal 519B and the flexible printed circuit FPC1 can be electrically connected to each other using a conductive material, for example.

Structure Example 3 of Display Panel 700

The display panel 700 includes a base material 510, a base material 770, and a sealant 705 (see FIG. 3A).

<<Base Material 510 and Base Material 770>>

A material having a light-transmitting property can be used for the base material 510 or the base material 770.

For example, a flexible material can be used for the base material 510 or the base material 770. Thus, a flexible display panel can be provided.

For example, a material with a thickness less than or equal to 0.7 mm and greater than or equal to 0.1 mm can be used. Specifically, a material polished to a thickness of approximately 0.1 mm can be used. Thus, the weight can be reduced.

A glass substrate of the 6th generation (1500 mm×1850 mm), the 7th generation (1870 mm×2200 mm), the 8th generation (2200 mm×2400 mm), the 9th generation (2400 mm×2800 mm), the 10th generation (2950 mm×3400 mm), or the like can be used as the base material 510 or the base material 770. Thus, a large-sized display device can be fabricated.

For the base material 510 or the base material 770, an organic material, an inorganic material, a composite material of an organic material and an inorganic material or the like can be used, for example.

For example, an inorganic material such as glass, ceramic, or a metal can be used. Specifically, non-alkali glass, soda-lime glass, potash glass, crystal glass, aluminosilicate glass, tempered glass, chemically tempered glass, quartz, sapphire, or the like can be used for the base material 510 or the base material 770. Alternatively, aluminosilicate glass, tempered glass, chemically tempered glass, sapphire, or the like can be suitably used for the base material 510 or the base material 770 that is provided on the side close to a user of the display panel. Thus, the display panel can be prevented from being broken or damaged by the use thereof.

Specifically, an inorganic oxide film, an inorganic nitride film, an inorganic oxynitride film, or the like can be used. For example, a silicon oxide film, a silicon nitride film, a silicon oxynitride film, an aluminum oxide film, or the like can be used. Stainless steel, aluminum, or the like can be used for the base material 510 or the base material 770.

For example, a single crystal semiconductor substrate of silicon or silicon carbide, a polycrystalline semiconductor substrate, a compound semiconductor substrate of silicon germanium or the like, an SOI substrate, or the like can be used as the base material 510 or the base material 770. Thus, a semiconductor element can be formed over the base material 510 or the base material 770.

For example, an organic material such as resin, a resin film, or plastic can be used for the base material 510 or the base material 770. Specifically, a material containing polyester, polyolefin, polyamide (nylon, aramid, or the like), polyimide, polycarbonate, polyurethane, an acrylic resin, an epoxy resin, or a resin having a siloxane bond can be used for the base material 510 or the base material 770. For example, a resin film, a resin plate, a stacked-layer material, or the like containing any of these materials can be used. Thus, the weight can be reduced. Alternatively, for example, the frequency of occurrence of breakage or the like due to dropping can be reduced.

Specifically, polyethylene terephthalate (PET), polyethylene naphthalate (PEN), polyethersulfone (PES), a cycloolefin polymer (COP), a cycloolefin copolymer (COC), or the like can be used for the base material 510 or the base material 770.

For example, a composite material formed by attaching a metal plate, a thin glass plate, or a film of an inorganic material or the like and a resin film or the like to each other can be used for the base material 510 or the base material 770. For example, a composite material formed by dispersing a fibrous or particulate metal, glass, an inorganic material, or the like into resin can be used for the base material 510 or the base material 770. For example, a composite material formed by dispersing a fibrous or particulate resin, an organic material, or the like into an inorganic material can be used for the base material 510 or the base material 770.

Furthermore, a single-layer material or a material in which a plurality of layers are stacked can be used for the base material 510 or the base material 770. For example, a material in which insulating films and the like are stacked can be used. Specifically, a material in which one or a plurality of films selected from a silicon oxide layer, a silicon nitride layer, a silicon oxynitride layer, and the like are stacked can be used. Thus, diffusion of impurities contained in the base materials can be prevented, for example. Alternatively, diffusion of impurities contained in glass or resin can be prevented. Alternatively, diffusion of impurities that pass through resin can be prevented.

Furthermore, paper, wood, or the like can be used for the base material 510 or the base material 770.

For example, a material having heat resistance high enough to withstand heat treatment in the fabricating process can be used for the base material 510 or the base material 770. Specifically, a material having heat resistance to heat applied in the formation process of directly forming the transistor, the capacitor, or the like can be used for the base material 510 or the base material 770.

For example, a method in which an insulating film, a transistor, a capacitor, or the like is formed on a substrate which is for use in the process and has heat resistance to heat applied in the fabricating process, and the formed insulating film, transistor, capacitor, or the like is transferred to the base material 510 or the base material 770 can be used. Accordingly, an insulating film, a transistor, a capacitor, or the like can be formed on a flexible substrate, for example.

<<Sealant 705>>

The sealant 705 includes a region sandwiched between the functional layer 520 and the base material 770 and has a function of bonding the functional layer 520 and the base material 770 together.

An inorganic material, an organic material, a composite material of an inorganic material and an organic material, or the like can be used for the sealant 705.

For example, an organic material such as a thermally fusible resin or a curable resin can be used for the sealant 705.

For example, an organic material such as a reactive curable adhesive, a photocurable adhesive, a thermosetting adhesive, and/or an anaerobic adhesive can be used for the sealant 705.

Specifically, an adhesive containing an epoxy resin, an acrylic resin, a silicone resin, a phenol resin, a polyimide resin, an imide resin, a PVC (polyvinyl chloride) resin, a PVB (polyvinyl butyral) resin, an EVA (ethylene vinyl acetate) resin, or the like can be used for the sealant 705.

Structure Example 4 of Display Panel 700

The display panel 700 includes a functional layer 720 (see FIG. 3A). In addition, the display panel 700 includes a structure body KB1, a functional film 770P, or the like.

<<Functional Layer 720>>

The functional layer 720 includes a coloring film CF(j), a light-blocking film BM, and an insulating film 771.

<<Coloring Film CF(j)>>

The coloring film CF(j) includes a region sandwiched between the base material 770 and the display element 550($i,j$). For example, a material that selectively transmits light of a predetermined color can be used for the coloring layer CF(j). Specifically, a material that transmits red light, green light, or blue light can be used for the coloring layer CF(j).

<<Insulating Film 771>>

The insulating film 771 includes a region; between the region and the base material 770, the light-blocking film BM is sandwiched.

The insulating film 771 includes a region; between the region and the base material 770, the coloring layer CF(j) is sandwiched.

<<Light-Blocking Film BM>>

The light-blocking film BM includes an opening portion in a region overlapping with the pixel 702($i,j$). For example, a material of a dark color can be used for the light-blocking film BM. Thus, the display contrast can be increased.

<<Structure Body KB1>>

The structure body KB1 includes a region sandwiched between the functional layer 520 and the base material 770. The structure body KB1 has a function of providing a predetermined space between the functional layer 520 and the base material 770.

<<Functional Film 770P and the Like>>

The functional film 770P includes a region overlapping with the display element 550($i,j$).

An anti-reflection film, a polarizing film, a retardation film, a light diffusion film, a condensing film, or the like can be used as the functional film 770P, for example.

For example, an anti-reflection film with a thickness of less than or equal to 1 μm can be used as the functional film 770P. Specifically, a stacked film in which three or more layers, preferably five or more layers, further preferably 15 or more layers of dielectrics are stacked can be used as the functional film 770P. This allows the reflectance to be as low as 0.5% or less, preferably 0.08% or less.

For example, a circularly polarizing film can be used as the functional film 770P.

Furthermore, an antistatic film inhibiting the attachment of a dust, a water repellent film inhibiting the attachment of a stain, an antireflective film (anti-reflection film), a non-glare film (anti-glare film), a hard coat film inhibiting generation of a scratch in use, or the like can be used as the functional film 770P.

Structure Example 2 of Display Element 550($i,j$)

For example, an element that controls light reflection, light transmission, or light emission can be used as the display element. Specifically, an electro-optic element or a light-emitting element can be used as the display element.

Structure Example 5 of Display Panel 700

The display panel 700 includes an insulating film 528 (see FIG. 3A). The display panel 700 also includes the insulating film 573.

<<Insulating Film 528>>

The insulating film 528 includes a region sandwiched between the insulating film 521 and the base material 770, and the insulating film 528 includes an opening portion in a region overlapping with the display element 550($i,j$) (see FIG. 3A).

The material that can be used for the insulating film 521, for example, can be used for the insulating film 528. Specifically, a silicon oxide film, a film containing an acrylic resin, a film containing polyimide, or the like can be used as the insulating film 528.

Structure Example 3 of Display Element 550($i,j$)

As the display element 550($i,j$), a light-emitting element can be used. For example, a layer 553($j$) containing a light-emitting material can be used for the display element 550($i,j$) (see FIG. 3A).

Specifically, an organic electroluminescence element, an inorganic electroluminescence element, a light-emitting diode, a QDLED (Quantum Dot LED), or the like can be used as the display element 550(i,j).

Structure Example 1 of Layer 553(j) Containing Light-Emitting Material

A belt-like stacked-layer material that is long in the column direction along the signal line S1(j) can be used for the layer 553(j) containing a light-emitting material, for example.

Specifically, materials emitting light with different hues can be used for the layer 553(j) containing a light-emitting material, a layer 553(j+1) containing a light-emitting material, and a layer 553(j+2) containing a light-emitting material. Thus, for example, the hue of the light emitted from the display element 550(i,j) can be different between columns.

For example, a material emitting blue light, a material emitting green light, or a material emitting red light can be used in the layer 553(j) containing a light-emitting material.

Structure Example 2 of Layer 553(j) Containing Light-Emitting Material

A stacked-layer material stacked to emit white light can be used for the layer 553(j) containing a light-emitting material, for example.

Specifically, materials emitting light with different hues can be used for the layer 553(j) containing a light-emitting material.

For example, a stacked-layer material in which a layer containing a light-emitting material including a fluorescent material that emits blue light and a layer containing materials that are other than fluorescent materials and that emit green light and red light are stacked can be used for the layer 553(j) containing a light-emitting material. Alternatively, a stacked-layer material in which a layer containing a material that is other than a fluorescent material and that emits yellow light is stacked can be used for the layer 553(j) including a light-emitting material.

Note that the layer 553(j) containing a light-emitting material can be used with the coloring film CF overlapping, for example. Thus, light of a predetermined hue can be extracted from white light. Alternatively, pixels displaying different hues can be arranged without separate formation of the layer 553(j) containing a light-emitting material.

Structure Example 3 of Layer 553(j) Containing Light-Emitting Material

A stacked-layer material stacked to emit blue light or ultraviolet rays can be used for the layer 553(j) containing a light-emitting material, for example. Furthermore, the layer 553(j) containing a light-emitting material can be used with a color conversion layer overlapping, for example.

For example, a material that emits light with a wavelength longer than a wavelength of incident light can be used for a color conversion layer CC(j). For example, a material that absorbs blue light or ultraviolet rays, converts it into green light, and emits the green light, a material that absorbs blue light or ultraviolet rays, converts it into red light, and emits the red light, or a material that absorbs ultraviolet light, converts it into blue light, and emits the blue light can be used for the color conversion layer. Specifically, a quantum dot with a diameter of several nanometers can be used for the color conversion layer. Thus, light having a spectrum with a narrow half width can be emitted. Alternatively, light with high saturation can be emitted.

Structure Example 4 of Layer 553(j) Containing Light-Emitting Material

A light-emitting unit can be used for the layer 553(j) containing a light-emitting material, for example. The light-emitting unit includes one region where electrons injected from one side are recombined with holes injected from the other side. The light-emitting unit contains a light-emitting material, and the light-emitting material releases energy generated by recombination of electrons and holes as light.

A plurality of light-emitting units and an intermediate layer can be used for the layer 5530) containing a light-emitting material, for example. The intermediate layer includes a region sandwiched between two light-emitting units. The intermediate layer includes a charge-generation region, and the intermediate layer has functions of supplying holes to the light-emitting unit provided on the cathode side and supplying electrons to the light-emitting unit provided on the anode side. Furthermore, a structure including a plurality of light-emitting units and an intermediate layer is referred to as a tandem light-emitting element in some cases.

Accordingly, the current efficiency of light emission can be increased. Alternatively, the density of current flowing through the light-emitting element at the same luminance can be reduced. Alternatively, the reliability of the light-emitting element can be increased.

For example, a light-emitting unit containing a material emitting light with one hue and a light-emitting unit containing a material emitting light with a different hue can be stacked and used for the layer 553(j) containing a light-emitting material. Alternatively, a light-emitting unit containing a material emitting light with one hue and a light-emitting unit containing a material emitting light with the same hue can be stacked and used for the layer 553(j) containing a light-emitting material. Specifically, two light-emitting units each containing a material emitting blue light can be stacked and used.

For the layer 553(j) containing a light-emitting material, a high molecular compound (e.g., an oligomer, a dendrimer, or a polymer), a middle molecular compound (a compound between a low molecular compound and a high molecular compound with a molecular weight greater than or equal to 400 and less than or equal to 4000), or the like can be used.

<<Electrode 551(i,j) and Electrode 552>>

For example, the material that can be used for the wiring or the like can be used for the electrode 551(i,j) or the electrode 552. Specifically, a material that has a visible-light-transmitting property can be used for the electrode 551(i,j) or the electrode 552.

For example, a conductive oxide, a conductive oxide containing indium, indium oxide, indium tin oxide, indium zinc oxide, zinc oxide, zinc oxide to which gallium is added, or the like can be used. Alternatively, a metal film thin enough to transmit light can be used. Alternatively, a material that has a visible-light-transmitting property can be used.

For example, a metal film that transmits part of light and reflects another part of the light can be used for the electrode 551(i,j) or the electrode 552. The distance between the electrode 551(i,j) and the electrode 552 is adjusted using the layer 553(j) containing a light-emitting material, for example.

Thus, a microcavity structure can be provided in the display element 550(i,j). Alternatively, light of a predetermined wavelength can be extracted more efficiently than other light. Alternatively, light with a narrow half width of a spectrum can be extracted. Alternatively, light of a bright color can be extracted.

For example, a film that efficiently reflects light can be used for the electrode 551(i,j) or the electrode 552. Specifically, a material containing silver, palladium, and the like or a material containing silver, copper, and the like can be used for the electrode 551(i,j) or the electrode 552.

The electrode 551(i,j) is electrically connected to the pixel circuit 530(i,j) in the opening portion 591A (see FIG. 3A). The electrode 551(i,j) overlaps with the opening portion formed in the insulating film 528, and the insulating film 528 is at the periphery of the electrode 551(i,j).

Thus, a short circuit between the electrode 551(i,j) and the electrode 552 can be prevented.

Structure Example 1 of Display Region 231

The display region 231 includes a plurality of pixels. For example, a plurality of pixels having a function of displaying colors with different hues can be used for the display region 231.

This enables additive mixture or subtractive mixture of colors displayed by the plurality of pixels. Alternatively, it is possible to display a color of a hue that an individual pixel cannot display.

Note that in the case where a plurality of pixels capable of displaying colors with different hues are used for color mixture, each of the pixels can be rephrased as a subpixel. In addition, a set of subpixels can be rephrased as a pixel.

Figure 1C:
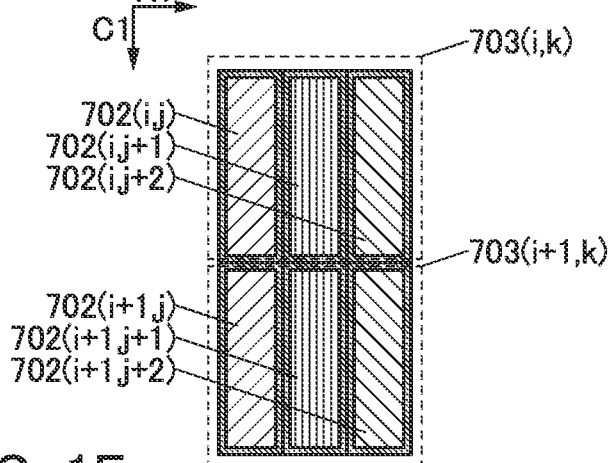

For example, the pixel 702(i,j) can be rephrased as a subpixel, and a set of the pixel 702(i,j), a pixel 702(i,j+1), and a pixel 702(i,j+2) can be rephrased as a pixel 703(i,k) (see FIG. 1C).

Figure 1D:
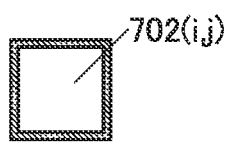
Figure 1E:
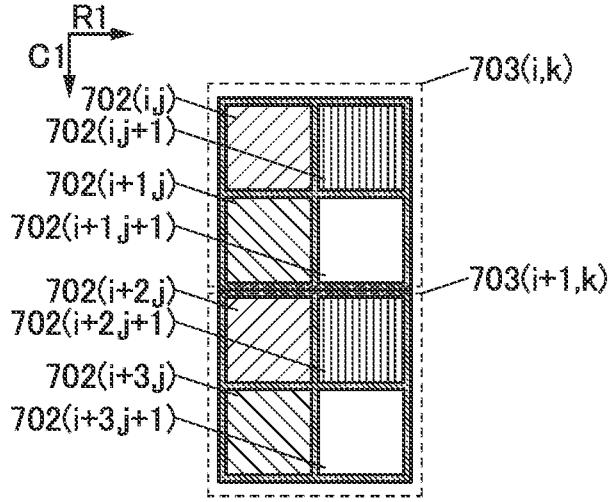

Alternatively, the pixel 702(i,j) can be rephrased as a subpixel, and a set of the pixel 702(i,j), a pixel 702(i,j+1), a pixel 702(i+1,j), and a pixel 702(i+1j+1) can be rephrased as a pixel 703(i,k) (see FIG. 1D and FIG. 1E).

Specifically, a set of a subpixel displaying blue, a subpixel displaying green, and a subpixel displaying red can be used as the pixel 703(i,k). Alternatively, a set of a subpixel displaying cyan, a subpixel displaying magenta, and a subpixel displaying yellow can be used as the pixel 703(i,k).

Furthermore, the above set to which a subpixel displaying white or the like is added can be used as the pixel, for example.

Structure Example 2 of Display Region 231

The display region 231 includes the pixel 702(i,j), the pixel 702(i,j+1), and the pixel 702(i,j+2) (see FIG. C).

The pixel 702(i,j) displays blue having a chromaticity x of greater than or equal to 0.120 and less than or equal to 0.170 and a chromaticity y of greater than or equal to 0.020 and less than 0.060 in the CIE 1931 chromaticity coordinates.

The pixel 702(i,j+1) displays green having a chromaticity x of greater than or equal to 0.130 and less than or equal to 0.250 and a chromaticity y of greater than 0.710 and less than or equal to 0.810 in the CIE 1931 chromaticity coordinates.

The pixel 702(i,j+2) displays red having a chromaticity x of greater than 0.680 and less than or equal to 0.720 and a chromaticity y of greater than or equal to 0.260 and less than or equal to 0.320 in the CIE1931 chromaticity coordinates.

The pixel 702(i,j), the pixel 702(i,j+1), and the pixel 702(i,j+$2$) are provided so that the area ratio of their color gamut to the BT.2020-2 color gamut in the CIE chromaticity diagram (x,y) is higher than or equal to 80%, or alternatively, the color gamut coverage is higher than or equal to 75%. Preferably, they are provided so that the area ratio is higher than or equal to 90%, or alternatively, the coverage is higher than or equal to 85%.

Accordingly, display with an extremely wide color gamut satisfying a color gamut of Recommendation ITU-R BT.2020-2 standard, which is an international standard, can be performed. Alternatively, extremely high-resolution display can be performed.

Note that this embodiment can be combined with other embodiments in this specification as appropriate.

Embodiment 2

In this embodiment, a fabrication method of a display panel of one embodiment of the present invention will be described with reference to FIG. 6 to FIG. 10.

FIG. 6 to FIG. 10 are cross-sectional views showing the method for fabricating the display panel of one embodiment of the present invention.

<Fabrication Method of Display Panel 700>

Figure 6:
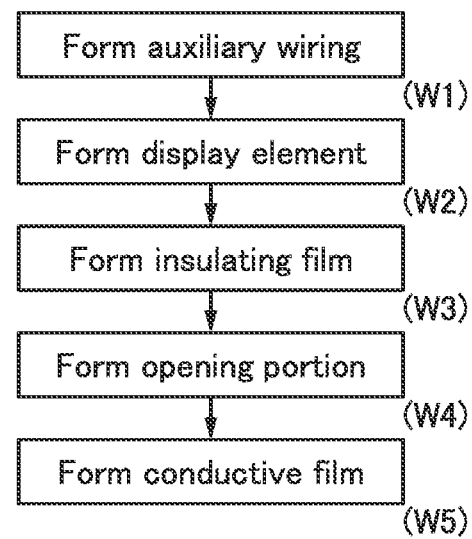
FIG. 6 is a flow chart showing a fabrication method of a display panel of one embodiment.

The fabrication method of the display panel described in this embodiment includes a first step to a fifth step (see FIG. 6). Note that in this embodiment, a fabrication method from the formation of the auxiliary wiring 554 to the formation of the conductive film 574 is described.

[First Step]

Figure 7A:
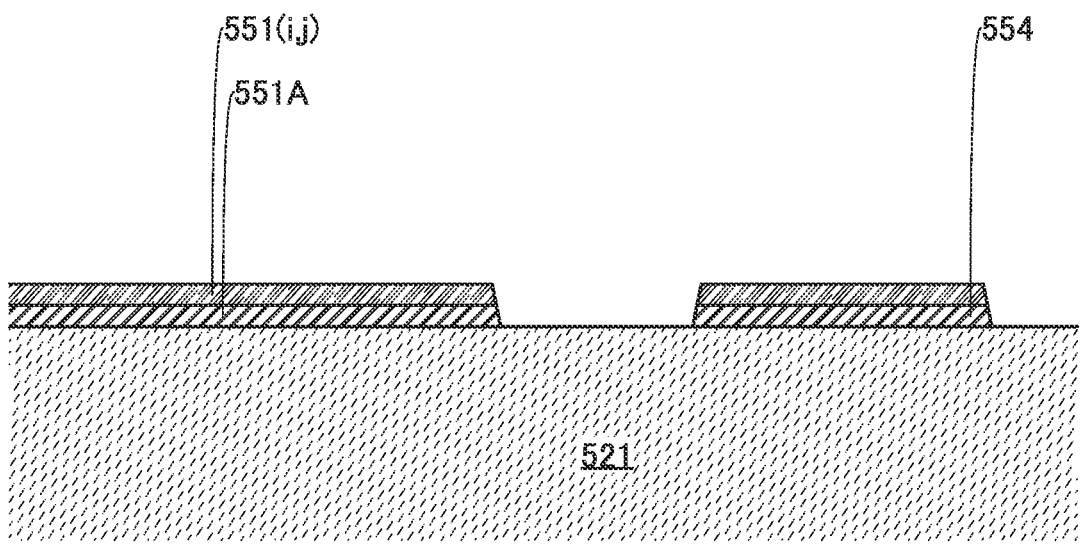
FIG. 7A and FIG. 7B are cross-sectional views illustrating a fabrication method of a display panel of one embodiment.

In the first step, the auxiliary wiring 554 is formed (see (W1) in FIG. 6 and FIG. 7A). Note that the electrode 551(i,j) can be formed in the step of forming the auxiliary wiring 554, for example.

Specifically, a stacked film in which the conductive film 551A having high visible-light reflectance and a conductive film having high visible-light transmittance are stacked is processed into a predetermined shape by a photolithography method.

Figure 7B:
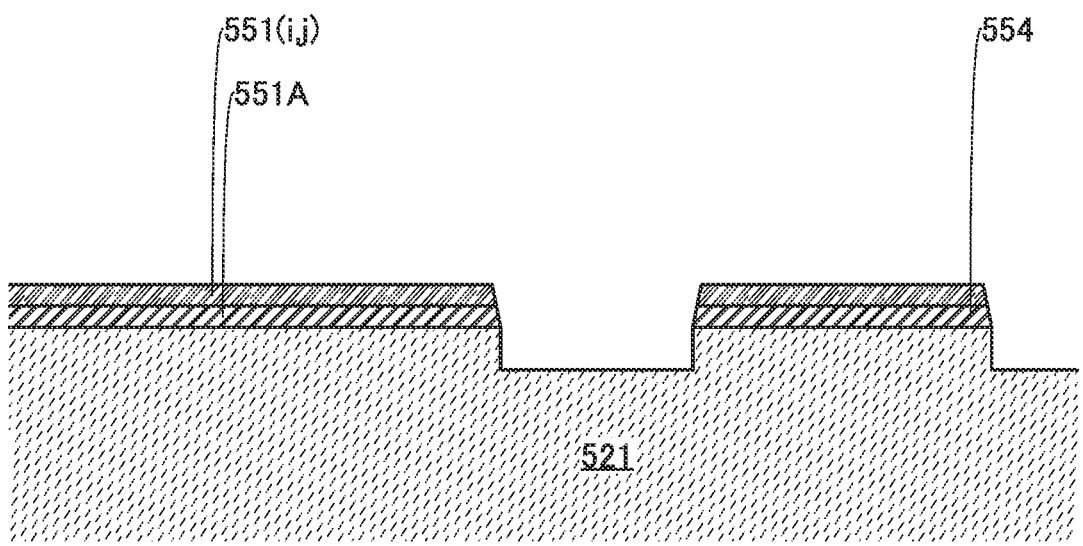

Note that the insulating film 521 can be etched using the conductive films processed into a predetermined shape as a mask (FIG. 7B). For example, a high molecular material such as polyimide is used for the insulating film 521, and the insulating film 521 is processed into a predetermined shape by an ashing method. In this manner, a step can be formed along the outer periphery of the electrode 551(i,j). Furthermore, the step can be formed along the outer periphery of the auxiliary wiring 554.

In addition, the insulating film 528 is formed. Specifically, an insulating film covering the electrode 551(i,j) is formed, and then an opening portion is formed in a region overlapping with the electrode 551(i,j) by a photolithography method (see FIG. 8A).

[Second Step]

Figure 8A:
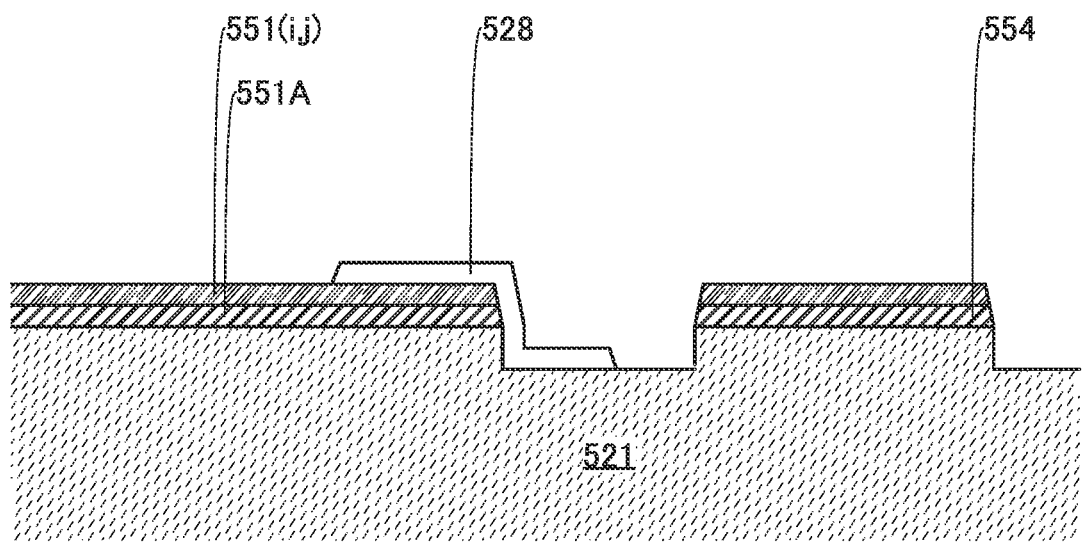
FIG. 8A and FIG. 8B are cross-sectional views illustrating a fabrication method of a display panel of one embodiment.
Figure 8B:
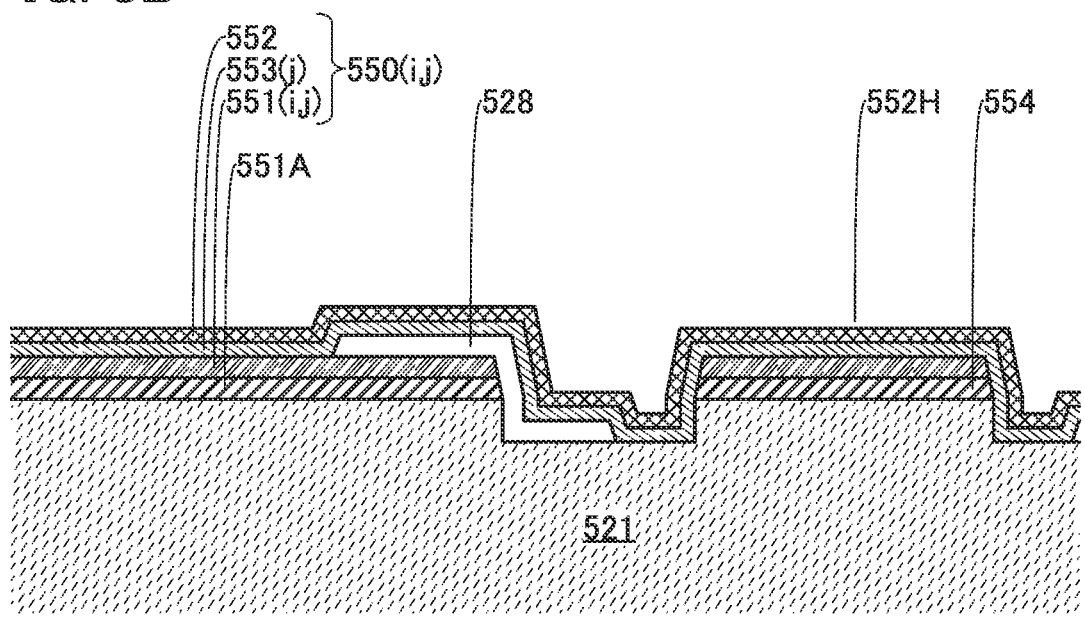

In the second step, the display element 550(i,j) is formed (see (W2) in FIG. 6 and FIG. 8B). Specifically, the layer 553(j) containing a light-emitting material is formed over the electrode 551(i,j), and the electrode 552 is formed over the layer 553(j) containing a light-emitting material.

Note that the insulating film 528 prevents a short circuit between the electrode 551(i,j) and the electrode 552 at the periphery of the electrode 551(i,j).

In addition, the thickness of the layer 553(j) containing a light-emitting material might be reduced on the side surface of the auxiliary wiring 554. In this case, the electrode 552 and the auxiliary wiring 554 can be electrically connected to each other.

[Third Step]

Figure 9A:
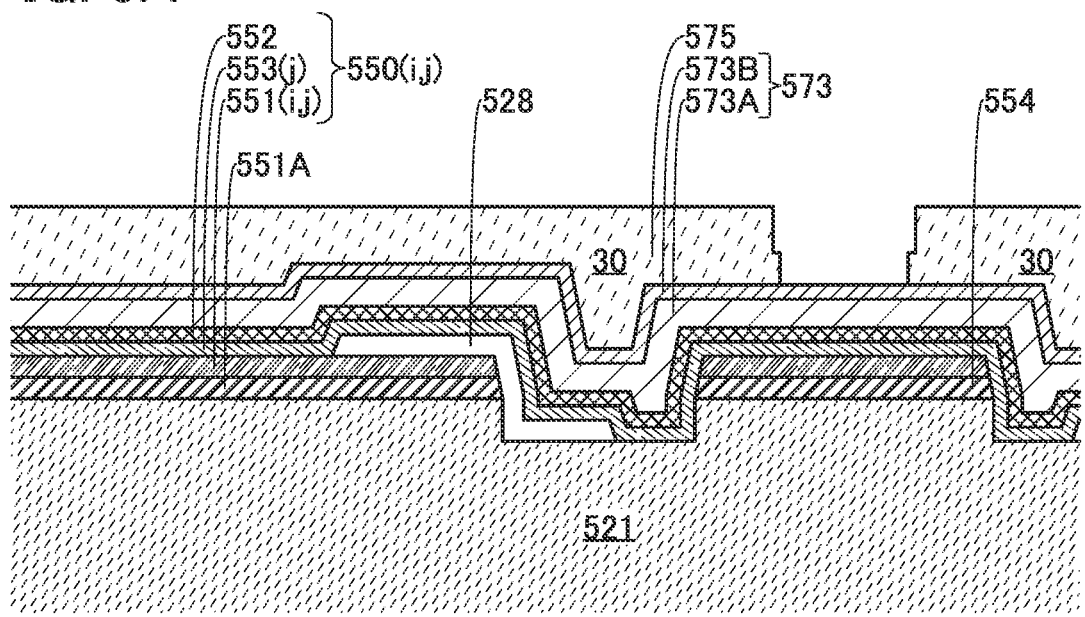
FIG. 9A and FIG. 9B are cross-sectional views illustrating a fabrication method of a display panel of one embodiment.

In the third step, the insulating film 573 is formed (see (W3) in FIG. 6 and FIG. 9A). Specifically, the insulating film 573 is formed by an evaporation method, a sputtering method, a chemical vapor deposition method, or the like.

For example, the insulating film 573A is formed over the electrode 552 by a chemical vapor deposition method, and the insulating film 573B is stacked over the insulating film 573A by an atomic layer deposition method.

Note that the insulating film 573 can inhibit diffusion of impurities into the display element 550($i,j$). Thus, a resist 30 can be formed over the insulating film 573.

[Fourth Step]

Figure 9B:
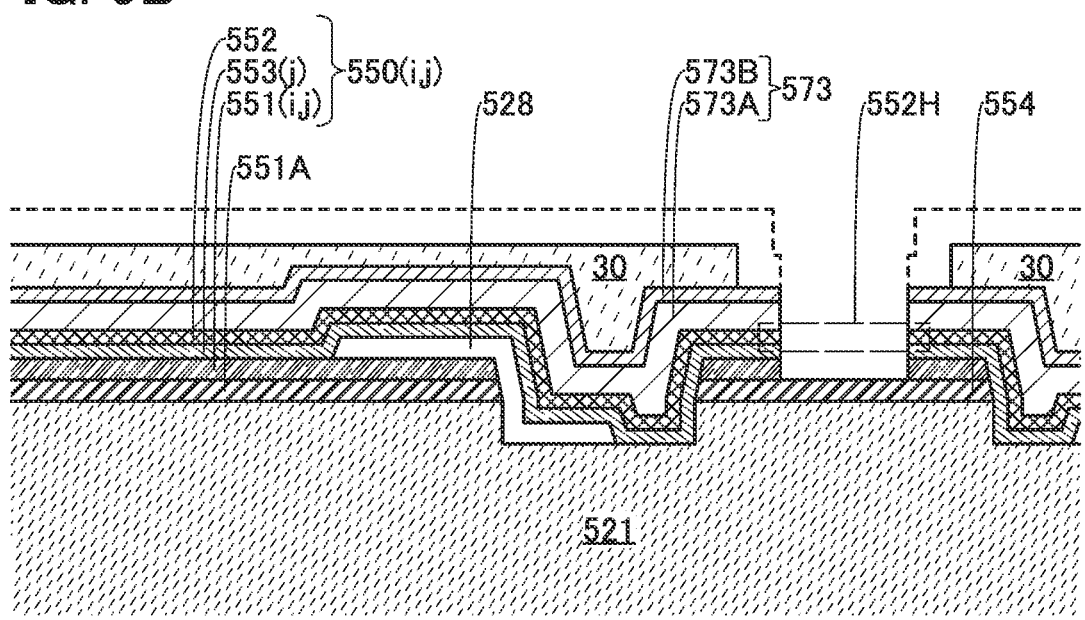

In the fourth step, the opening portion 552H is formed (see (W4) in FIG. 6 and FIG. 9B). Specifically, the insulating film 573, the electrode 552, and the layer 553($j$) containing a light-emitting material are processed by a dry etching method.

For example, an opening portion is formed in the insulating film 573 using a gas containing fluorine. Furthermore, an opening portion is formed in the electrode 552 using a gas containing chlorine or a gas containing methane, for example. Moreover, an opening portion is formed in the layer 553 containing a light-emitting material using a gas containing oxygen, for example. Note that part of the auxiliary wiring 554 is removed in some cases.

After the opening portion 552H is formed, the resist 30 is processed into a predetermined shape (see FIG. 9B). Specifically, an end portion of the resist 30 can be made to recede by an ashing method. Thus, the opening portion of the resist 30 can be widened. Furthermore, the thickness of the resist 30 is reduced.

For example, a thin region is formed in the resist 30 using one photomask. Specifically, a photosensitive resin is processed using a gray tone mask, a half tone mask, or the like. Thus, regions exposed to different amount of light can be formed in a positive photosensitive resin, for example. Alternatively, the resist 30 including regions with different thicknesses can be formed using one photomask.

Figure 10A:
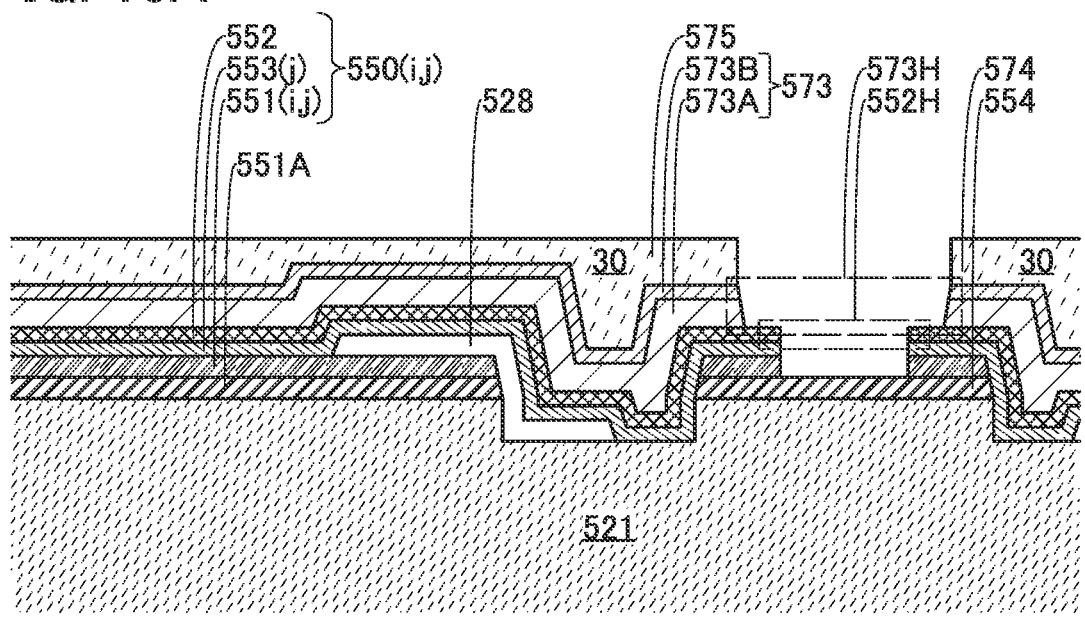
FIG. 10A and FIG. 10B are cross-sectional views illustrating a fabrication method of a display panel of one embodiment.

The opening portion 573H is formed in the insulating film 573 using the resist 30 processed into a predetermined shape (see FIG. 10A). Thus, the area of the opening portion 552H can be smaller than the area of the opening portion 573H.

[Fifth Step]

Figure 10B:
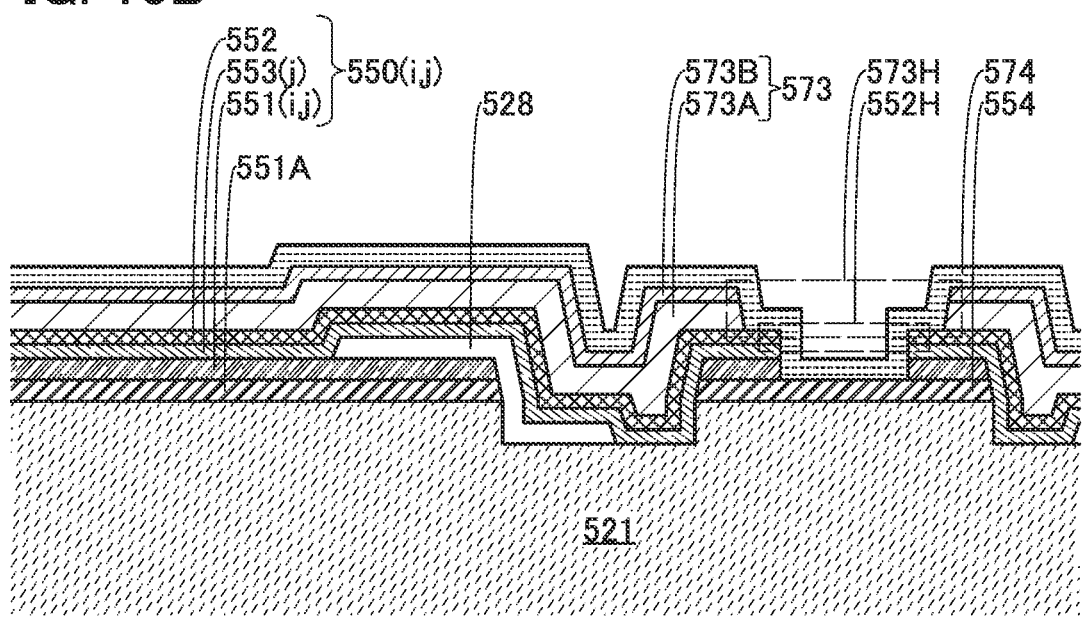

In the fifth step, the conductive film 574 is formed (see (W5) in FIG. 6 and FIG. 10B). The conductive film 574 is formed by a sputtering method, for example. Thus, the conductive film 574 can be electrically connected to the electrode 552. Alternatively, the auxiliary wiring 554 and the electrode 552 can be electrically connected to each other at a predetermined position without processing the conductive film 574 by an etching method or the like. Alternatively, the contact area between the conductive film 574 and the electrode 552 can be increased.

Note that this embodiment can be combined with other embodiments in this specification as appropriate.

Embodiment 3

In this embodiment, a structure of a display panel of one embodiment of the present invention will be described with reference to FIG. 11.

Figure 11:
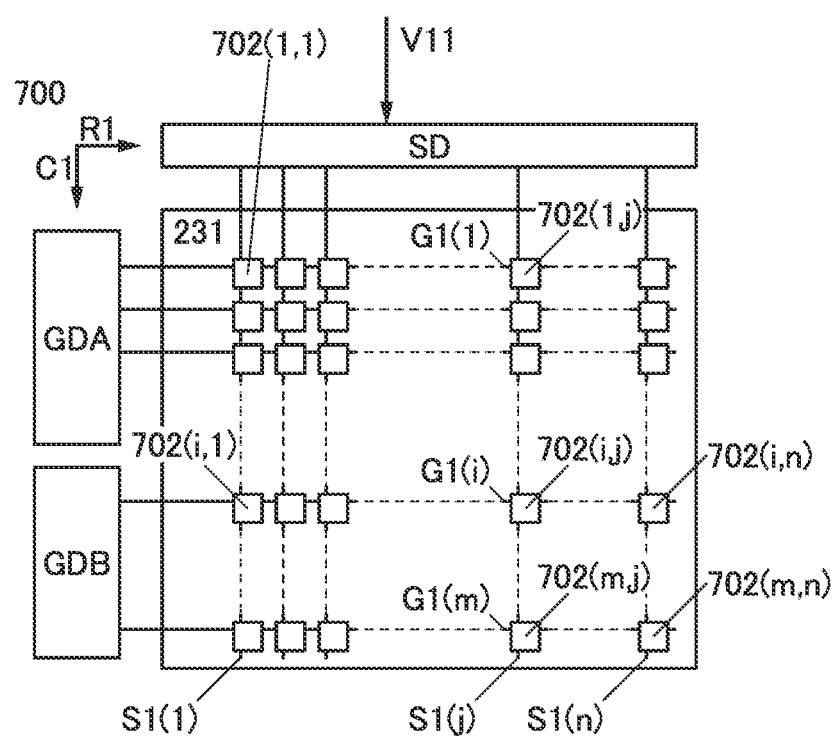
FIG. 11 is a block diagram illustrating a structure of a display panel of one embodiment.

FIG. 11 is a diagram illustrating the structure of the display panel of one embodiment of the present invention.

Structure Example 1 of Display Panel 700

The display panel described in this embodiment includes the display region 231.

Structure Example 1 of Display Region 231

The display region 231 includes a group of pixels 702($i,1$) to 702($i,n$), another group of pixels 702($1,j$) to 702($m,j$), the scan line G1($i$), and the signal line S1($j$) (see FIG. 11). Note that i is an integer greater than or equal to 1 and less than or equal to m, j is an integer greater than or equal to 1 and less than or equal to n, and m and n are each an integer greater than or equal to 1.

Although not illustrated, the display region 231 includes a conductive film VCOM2 and the conductive film ANO.

The group of pixels 702($i,1$) to 702($i,n$) is arranged in the row direction (the direction indicated by an arrow R1 in the drawing), and the group of pixels 702($i,j$) to 702($i,n$) includes the pixel 702($i,j$).

The another group of pixels 702($1$) to 702($m,j$) is arranged in the column direction intersecting the row direction (the direction indicated by an arrow C1 in the drawing), and the another group of pixels 702($1,i$) to 702($m,j$) includes the pixel 702($i,j$).

The scan line G1($i$) is electrically connected to the group of pixels 702($i,1$) to 702($in$) arranged in the row direction.

The signal line S1($j$) is electrically connected to the another group of pixels 702($1,j$) to 702($m,j$) arranged in the column direction.

Thus, image data can be supplied to a plurality of pixels. As a result, a novel display panel that is highly convenient or reliable can be provided.

Structure Example 2 of Display Region 231

The display region 231 includes a plurality of pixels in a matrix. For example, the display region 231 includes 7600 or more pixels in the row direction and the display region 231 includes 4300 or more pixels in the column direction. Specifically, 7680 pixels are provided in the row direction and 4320 pixels are provided in the column direction.

Thus, a high-resolution image can be displayed. As a result, a novel display panel that is highly convenient or reliable can be provided.

Structure Example 3 of Display Region 231

The diagonal size of the display region 231 is greater than or equal to 5 inches and less than or equal to 200 inches, preferably greater than or equal to 20 inches and less than or equal to 150 inches.

In this case, the use of the auxiliary wiring 554 can compensate for the conductivity of the electrode 522. Alternatively, the use of the auxiliary wiring 554 can compensate for a voltage drop due to the electric resistance of the electrode 522. Alternatively, display unevenness due to the voltage drop can be reduced. Alternatively, a realistic image can be displayed. As a result, a novel display panel that is highly convenient or reliable can be provided.

Structure Example 2 of Display Panel 700

The display panel 700 described in this embodiment includes one or more driver circuits. For example, a driver circuit GD and a driver circuit SD can be included (see FIG. 11).

<<Driver Circuit GDA and Driver Circuit GDB>>

A driver circuit GDA and a driver circuit GDB can be used as the driver circuit GD. For example, the driver circuit GDA and the driver circuit GDB each have a function of supplying a selection signal on the basis of control data.

Specifically, the driver circuit GDA and the driver circuit GDB each have a function of supplying a selection signal to one scan line at a frequency of 30 Hz or higher, preferably 60 Hz or higher, on the basis of the control data. Accordingly, a moving image can be smoothly displayed.

Alternatively, the driver circuit GDA and the driver circuit GDB each have a function of supplying a selection signal to one scan line at a frequency lower than 30 Hz, preferably lower than 1 Hz, further preferably less than once a minute, on the basis of the control data. Accordingly, a still image in which flickering is reduced can be displayed.

In the case where a plurality of driver circuits are included, for example, the frequency at which the driver circuit GDA supplies a selection signal and the frequency at which the driver circuit GDB supplies a selection signal can be made different from each other. Specifically, the selection signal can be supplied at a higher frequency to a region on which a moving image is displayed than to a region on which a still image is displayed. Accordingly, a still image in which flickering is reduced can be displayed on a region, and a moving image can be smoothly displayed on another region.

The frame frequency can be variable. For example, display can be performed at a frame frequency of higher than or equal to 1 Hz and lower than or equal to 120 Hz. Alternatively, display can be performed at a frame frequency of 120 Hz by a progressive method.

A bottom-gate transistor or a top-gate transistor can be used in the driver circuit GD, for example. Specifically, a transistor MD can be used in the driver circuit GD (see FIG. 4).

Note that for example, a semiconductor film used for a transistor in the driver circuit GD can be formed in a step of forming a semiconductor film used for a transistor in the pixel circuit 530(*i,j*).

<<Driver Circuit SD>>

The driver circuit SD has a function of generating an image signal on the basis of data V11 and a function of supplying the image signal to a pixel circuit electrically connected to one display element (see FIG. 11).

A variety of sequential circuits such as a shift register can be used as the driver circuit SD, for example.

For example, an integrated circuit formed on a silicon substrate can be used as the driver circuit SD.

An integrated circuit can be connected to a terminal by a COG (Chip on glass) method or a COF (Chip on Film) method, for example. Specifically, an anisotropic conductive film can be used to connect an integrated circuit to a terminal.

Note that this embodiment can be combined with other embodiments in this specification as appropriate.

Embodiment 4

In this embodiment, a structure of a display device of one embodiment of the present invention will be described with reference to FIG. 12.

FIG. 12 is a diagram illustrating the structure of the display device of one embodiment of the present invention. FIG. 12A is a block diagram of the display device of one embodiment of the present invention, and FIG. 12B1 to FIG. 12B3 are projection views each illustrating the appearance of the display device of one embodiment of the present invention.

Structure Example of Display Device

Figure 12A:
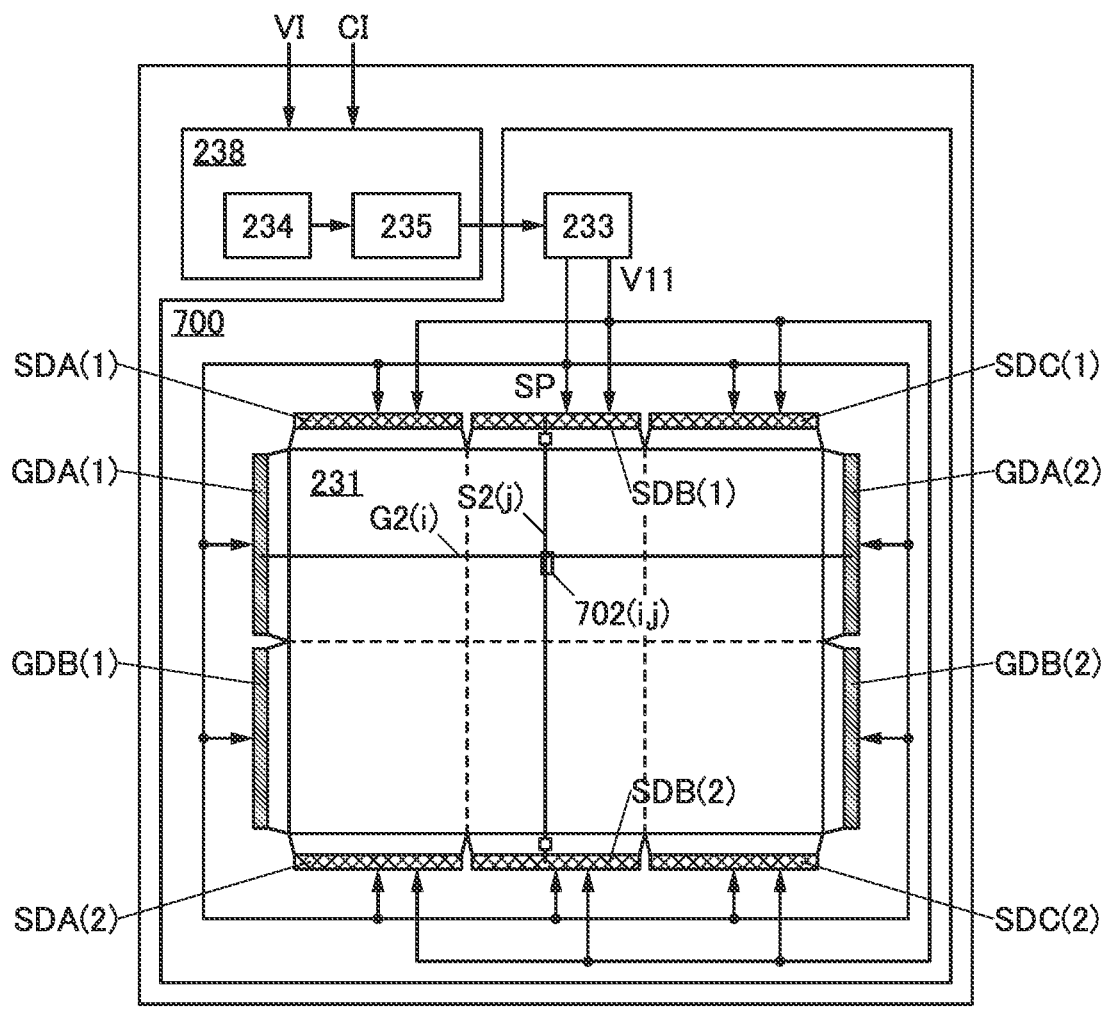
Figure 12A:
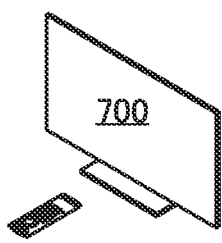
Figure 12A:
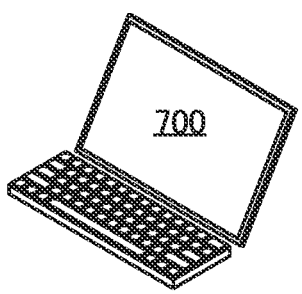
Figure 12A:
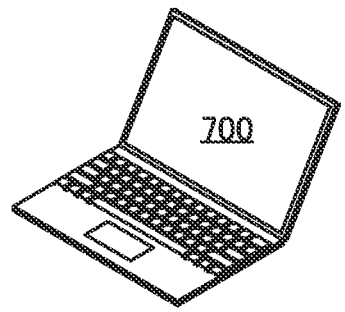

The display device described in this embodiment includes the display panel 700 and a control portion 238 (see FIG. 12A).

Structure Example 1 of Control Portion 238

The control portion 238 is supplied with image data VI and control data CI. For example, a clock signal, a timing signal, or the like can be used as the control data CI.

The control portion 238 generates data V11 on the basis of the image data VI and generates a control signal SP on the basis of the control data CI. Furthermore, the control portion 238 supplies the data V11 and the control signal SP.

The data V11 includes a grayscale of 8 bits or more, preferably 12 bits or more, for example. In addition, a clock signal, a start pulse, or the like of a shift register used for a driver circuit can be used as the control signal SP, for example.

Structure Example 2 of Control Portion 238

For example, a decompression circuit 234 and an image processing circuit 235 can be used in the control portion 238.

<<Decompression Circuit 234>>

The decompression circuit 234 has a function of decompressing the image data VI supplied in a compressed state. The decompression circuit 234 includes a memory portion. The memory portion has a function of storing decompressed image data, for example.

<<Image Processing Circuit 235>>

The image processing circuit 235 includes a memory region, for example. The memory region has a function of storing data included in the image data VI, for example.

The image processing circuit 235 has a function of generating the data V11 by correcting the image data VI on the basis of a predetermined characteristic curve and a function of supplying the data V11, for example.

Structure Example 1 of Display Panel

The display panel 700 is supplied with the data V11 and the control signal SP. For example, a driver circuit can be used in the display panel 700. Specifically, the display panel 700 described in Embodiment 1 or Embodiment 3 can be used.

<<Driver Circuit>>

The driver circuit operates on the basis of the control signal SP. Using the control signal SP enables a synchronized operation of a plurality of driver circuits.

For example, a driver circuit GDA(1), a driver circuit GDA(2), a driver circuit GDB(1) and a driver circuit GDB(2) can be used in the display panel. The driver circuit GDA(1), the driver circuit GDA(2), the driver circuit GDB(1), and the driver circuit GDB(2) are supplied with the control signal SP and have a function of supplying a selection signal.

For example, a driver circuit SDA(1), a driver circuit SDA(2), a driver circuit SDB(1), a driver circuit SDB(2), a driver circuit SDC(1), and the driver circuit SDC(1) can be used in the display panel. The driver circuit SDA(1), the driver circuit SDA(2), the driver circuit SDB(1), the driver circuit SDB(2), the driver circuit SDC(1), and the driver circuit SDC(1) are supplied with the control signal SP and the data V11 and capable of supplying an image signal.

Structure Example of Pixel 702(i,j)

The pixel 702(i,j) performs display on the basis of the data V11.

Thus, the image data can be displayed using the display element. As a result, a novel display device that is highly convenient or reliable can be provided. Alternatively, for example, a television receiver system (see FIG. 12B1), a video monitor (see FIG. 12B2), a laptop computer (see FIG. 12B3), or the like can be provided.

Structure Example 2 of Display Panel

For example, the control circuit 233 can be used in the display panel 700. Specifically, the control circuit 233 formed over a rigid substrate can be used for the display panel 700. The control circuit 233 formed over the rigid substrate can be electrically connected to the control portion 238 with the use of a flexible printed circuit.

<<Control Circuit 233>>

The control circuit 233 has a function of generating and supplying the control signal SP. For example, a clock signal or a timing signal can be used as the control signal SP. Specifically, a timing controller can be used as the control circuit 233.

Note that this embodiment can be combined with other embodiments in this specification as appropriate.

Embodiment 5

In this embodiment, a structure of an input/output device of one embodiment of the present invention will be described with reference to FIG. 13 to FIG. 15.

Figure 13:
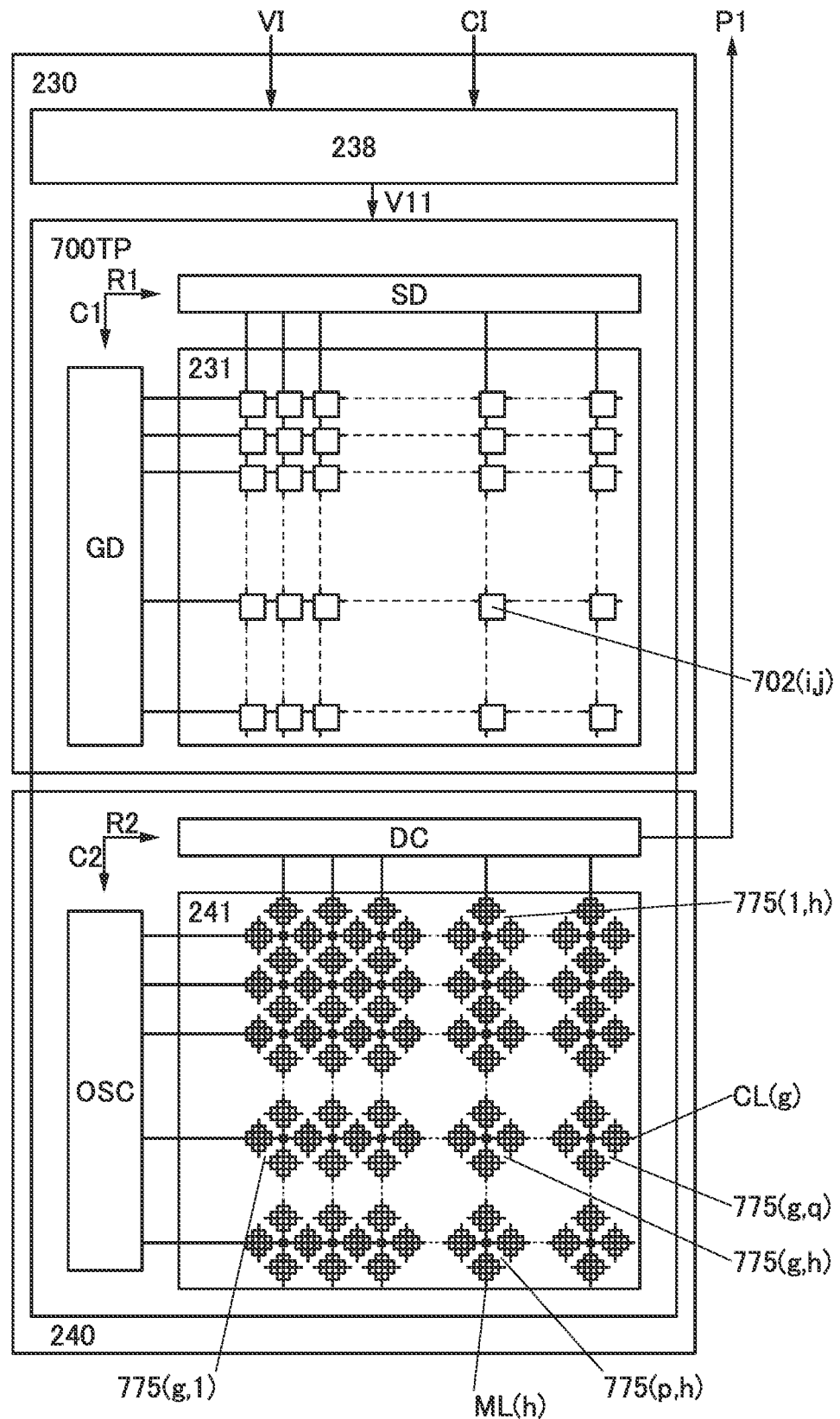
FIG. 13 is a block diagram illustrating a structure of an input/output device of one embodiment.

FIG. 13 is a block diagram illustrating the structure of the input/output device of one embodiment of the present invention.

FIG. 14 is a diagram illustrating the structure of the input/output device of one embodiment of the present invention. FIG. 14A is a perspective view of the input/output device of one embodiment of the present invention, FIGS. 14B and 14C are cross-sectional views illustrating part of FIG. 14A, and FIG. 14D shows an electric resistance-stress curve which schematically illustrates characteristics of a sensing element.

Figure 14A:
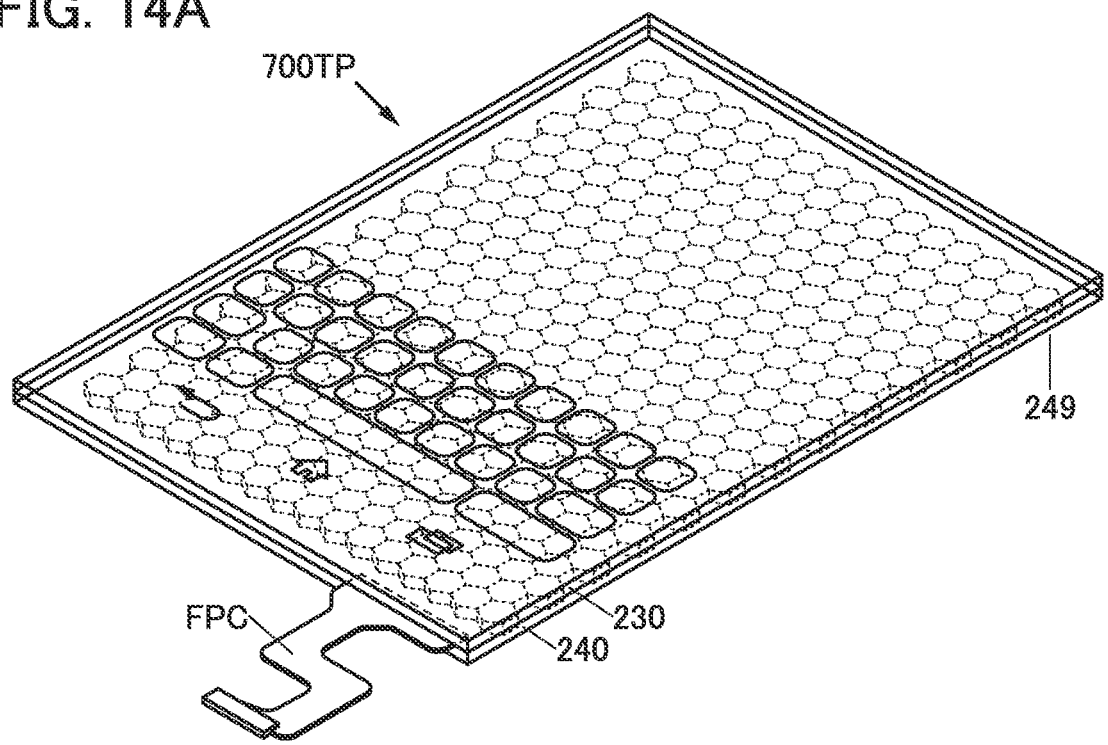
FIG. 14A to FIG. 14D are diagrams illustrating a structure of an input/output device of one embodiment.

FIG. 15 is a diagram illustrating the structure of the input/output device of one embodiment of the present invention. FIG. 15A is a perspective view of a component used for the input/output device of one embodiment of the present invention, FIGS. 15B and 15C are cross-sectional views illustrating part of FIG. 14A, and FIG. 15D shows stress-distortion curve which schematically illustrates characteristics of a component in which snap-through buckling occurs.

Structure Example 1 of Input/Output Device

The input/output device described in this embodiment includes an input portion 240 and a display portion 230 (see FIG. 13).

<<Display Portion 230>>

The display portion 230 includes a display panel. For example, the display panel 700 described in Embodiment 1 or Embodiment 3 can be used for the display portion 230.

Note that a structure including the input portion 240 and the display portion 230 can be referred to as an input/output panel 700TP.

Structure Example 1 of Input Portion 240

The input portion 240 includes a sensing region 241. The input portion 240 has a function of sensing an object approaching the sensing region 241.

The sensing region 241 includes a region overlapping with the pixel 702(i,j).

Thus, the object approaching the region overlapping with the display portion can be sensed while image data is displayed using the display portion. Alternatively, a finger or the like that approaches the display portion can be used as a pointer to input positional data. Alternatively, positional data can be associated with image data displayed on the display portion. As a result, a novel input/output device that is highly convenient or reliable can be provided.

Structure Example 1 of Sensing Region 241

The sensing region 241 includes one or more sensing elements, for example.

The sensing region 241 includes a group of sensing elements 775(g,1) to 775(g,q) and another group of sensing elements 775(1,h) to 775(p,h). Note that g is an integer greater than or equal to 1 and less than or equal top, h is an integer greater than or equal to 1 and less than or equal to q, and p and q are each an integer greater than or equal to 1.

The group of sensing elements 775(g,1) to 775(g,q) includes a sensing element 775(g,h) and is provided in the row direction (the direction indicated by an arrow R2 in the drawing). Note that the direction indicated by the arrow R2 may be the same as or different from the direction indicated by the arrow R1.

The another group of sensing elements 775(1,h) to 775(p,h) includes the sensing element 775(g,h) and is provided in the column direction (the direction indicated by an arrow C2 in the drawing) that intersects the row direction.

<<Sensing Element>>

The sensing element has a function of sensing an approaching pointer. For example, a finger or a stylus pen can be used as the pointer. For example, a piece of metal or a coil can be used for the stylus pen.

Specifically, a capacitive proximity sensor, an electromagnetic inductive proximity sensor, an optical proximity sensor, a resistive proximity sensor, or the like can be used as the sensing element.

A plurality of types of sensing elements can be used in combination. For example, a sensing element that senses a finger and a sensing element that senses a stylus pen can be used in combination.

This allows determination of the kind of a pointer. Alternatively, different instructions can be associated with pieces of sensing data depending on the kind of a pointer that has been determined. Specifically, in the case where it is determined that a finger is used as a pointer, sensing data can be associated with a gesture. Alternatively, in the case where it is determined that a stylus pen is used as a pointer, sensing data can be associated with drawing processing.

Specifically, a finger can be sensed using a capacitive, pressure-sensitive, or optical proximity sensor. Alternatively, a stylus pen can be sensed using an electromagnetic inductive or optical proximity sensor.

Structure Example 2 of Input Portion 240

The input portion 240 includes an oscillation circuit OSC and a sensing circuit DC (see FIG. 13).

The oscillation circuit OSC supplies a search signal to the sensing element 775(g,h). For example, a rectangular wave, a sawtooth wave, a triangular wave, or a sine wave can be used as the search signal.

The sensing element 775(g,h) generates and supplies a sensing signal that changes in accordance with the search signal and the distance to a pointer approaching the sensing element 775(g,h).

The sensing circuit DC supplies input data in accordance with the sensing signal.

Accordingly, the distance from an approaching pointer to the sensing region 241 can be sensed. Alternatively, the position in the sensing region 241 where the pointer comes the closest can be sensed.

Structure Example 2 of Display Region 231

Figure 14B:
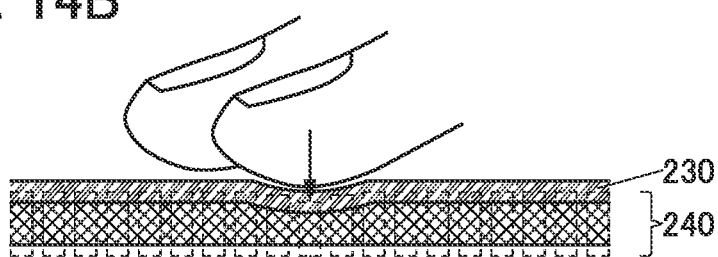
Figure 14C:
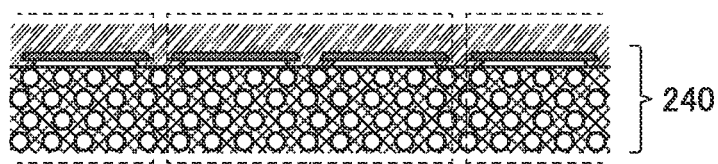
Figure 14D:
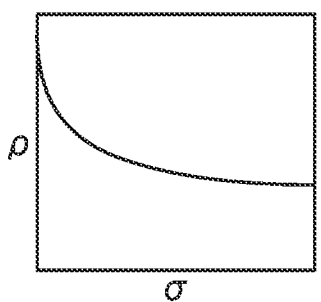

The display region 231 is provided closer to the side where the pointer approaches than the sensing region 241 is, and the display region 231 has flexibility (see FIGS. 14A and 14B). For example, an image indicating a keyboard can be displayed on the display region 231 (see FIG. 14A).

Structure Example 2 of Sensing Element

The sensing element 775(g,h) has a function of sensing the pushing depth and The sensing element 775(g,h) senses a pointer through the display region 231 (see FIG. 14B).

For example, the sensing element 775(g,h) senses the pushing depth toward the sensing element 775(g,h) with the pointer. Specifically, the sensing element 775(g,h) senses the pushing depth from a plane including the display region 231 to a plane including the sensing region 241 with a finger or a stylus pen (see FIG. 14C).

For example, a pressure sensor can be used as the sensing element 775(g,h). Specifically, an element whose electric resistance changes in accordance with a pressure can be used as the sensing element 775(g,h) (see FIG. 14D). Thus, the sensing element 775(g,h) can sense the pushing depth.

Structure Example 2 of Input/Output Device

Figure 15A:
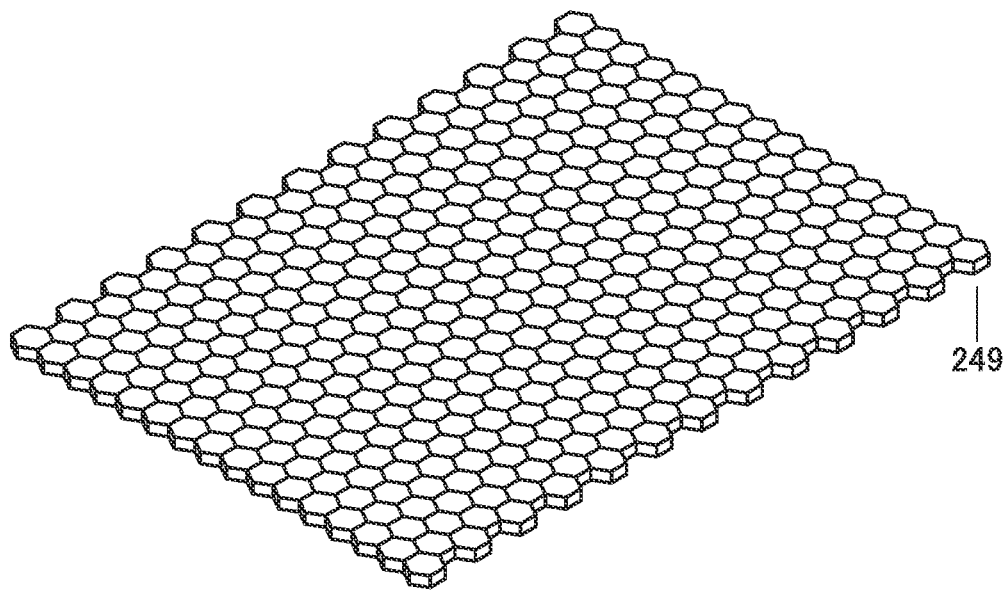
FIG. 15A to FIG. 15D are diagrams illustrating a structure of an input/output device of one embodiment.
Figure 15B:
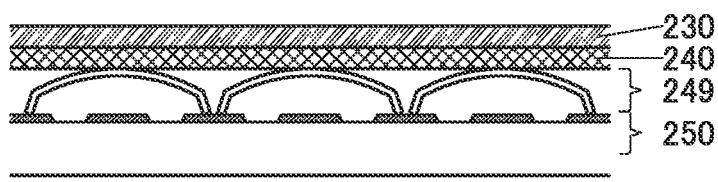

The input/output device described in this embodiment includes a component 249 (see FIGS. 14A and 15A).

Structure Example of Component 249

The component 249 overlaps with the sensing region 241 and has elasticity.

For example, an elastic body can be used for the component 249. Specifically, a spring, a plate spring, a rubber, a sponge, or the like can be used.

Thus, the sensing element 775(g,h) can sense the pushing depth. Alternatively, a user can feel the force corresponding to the pushing depth with the pointer.

For example, the component in which snap-through buckling occurs can be used for the component 249. Specifically, as the component 249, a dome-shaped component can be used, for example (see FIG. 15B).

Figure 15C:
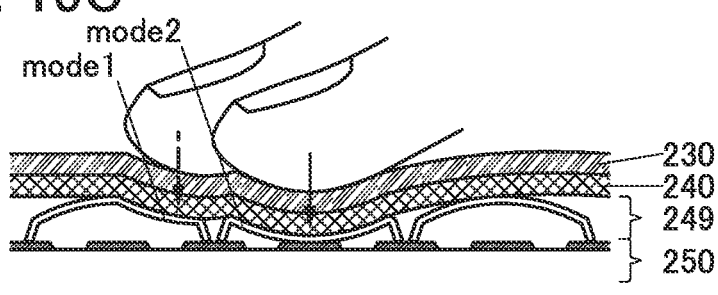
Figure 15D:
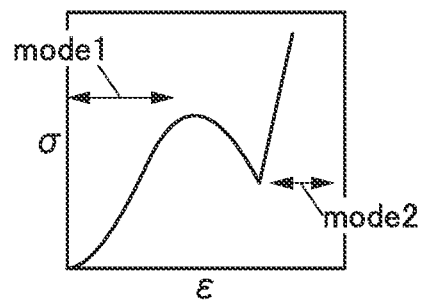

The component 249 has a mode 1 in which the component 249 is stable in a region with small distortion and a mode 2 in which the component 249 is stable in a region with large distortion a (see FIGS. 15C and 15D). The component 249 changes from the mode 1 to the mode 2 at the buckling point (see FIG. 15D). Furthermore, the component 249 reversibly changes from the mode 2 to the mode 1 when the distortion is eliminated.

Thus, the sensing element 775(g,h) can sense the force a corresponding to the pushing depth up to the buckling point. A user can obtain a sense of the force. When the force exceeds the buckling point, the user can have a click feeling. What is called a tactile switch can be provided. When the user releases the pushed pointer, the component in which snap-through buckling occurs can return to the original mode.

Note that the sensing region 241 can be provided to overlap with the component in which snap-through buckling occurs, the display region 231 can be provided to overlap with the sensing region 241, and an image used for operation can be displayed at a position overlapping with the component in which snap-through buckling occurs. For example, a layout that is suitably used for a keyboard can be employed for the layout of the components in which snap-through buckling occurs. Alternatively, a layout that is suitably used for a home button can be employed for the layout of the components in which snap-through buckling occurs.

Thus, the displayed images used for operation can be pressed. Alternatively, the user can have a click feeling when pressing the images.

Furthermore, it is possible to use the component 249 including a region where a plurality of components in which snap-through buckling occurs are provided on the whole area. The sensing region 241 can be provided to overlap with the region, the display region 231 can be provided to overlap with the sensing region 241, and the image used for operation can be displayed at a position that overlaps with the region, the whole area of which is provided with the components.

Thus, images which are used for operation and can provide a click feeling by being pressed can be freely laid out.

Note that a sensing portion 250 may be provided to overlap with the input/output device described in this embodiment. For example, a pressure-sensitive switch can be used for the sensing portion 250. Specifically, a conductive material is used for a dome-shaped component in which snap-through buckling occurs, and the dome-shaped component can be used at a contact point with the pressure-sensitive switch. Thus, what is called a membrane switch can be provided. Alternatively, a switch that provides a click feeling can be provided. Alternatively, what is called a tactile switch can be provided.

Note that this embodiment can be combined with other embodiments in this specification as appropriate.

Embodiment 6

In this embodiment, structures of a data processing device of one embodiment of the present invention will be described with reference to FIG. 16 to FIG. 18

Figure 16A:
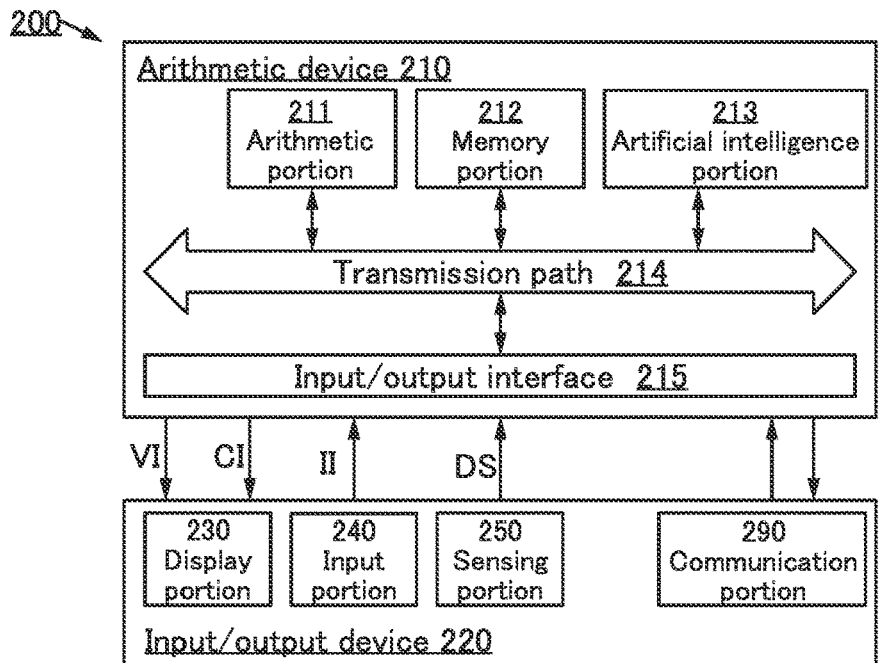
FIG. 16A to FIG. 16C are a block diagram and projection views illustrating structures of a data processing device of one embodiment.
Figure 16B:
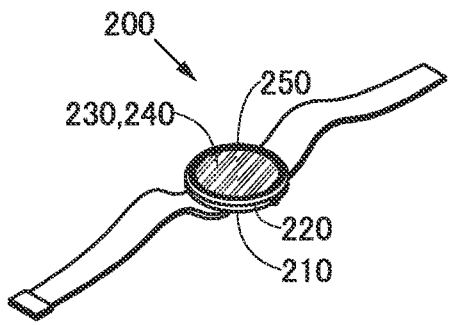
Figure 16C:
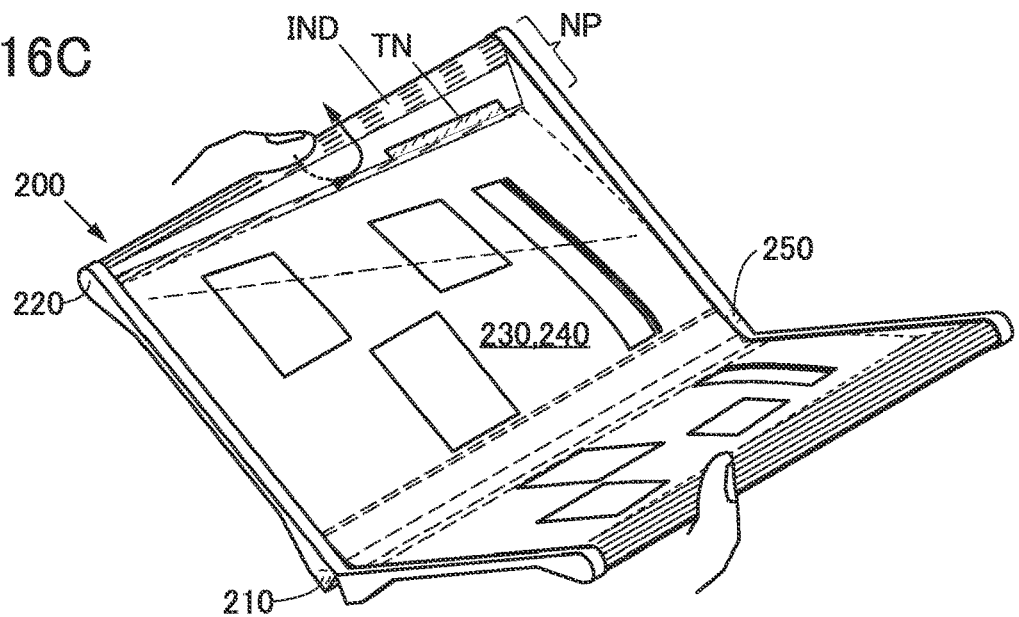

FIG. 16A is a block diagram illustrating the structure of the data processing device of one embodiment of the present invention. FIG. 16B and FIG. 16C are projection views illustrating examples of the appearance of the data processing device.

Figure 17A:
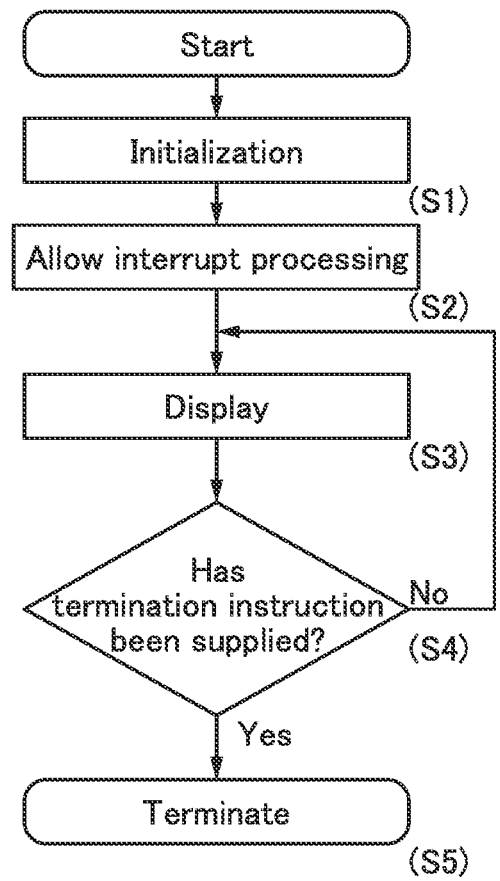
FIG. 17A and FIG. 17B are flow charts showing a driving method of a data processing device of one embodiment.
Figure 17B:
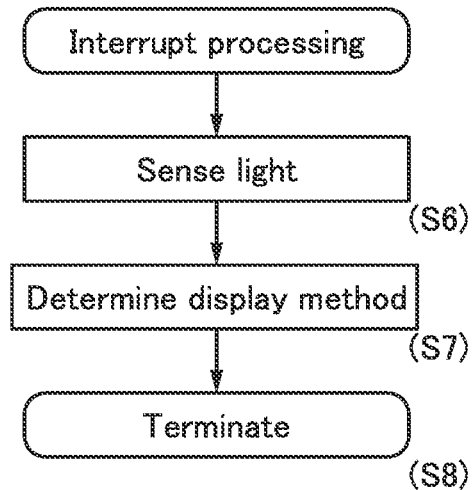

FIG. 17 is a flow chart showing a program of one embodiment of the present invention. FIG. 17A is a flow chart showing main processing of the program of one embodiment of the present invention, and FIG. 17B is a flow chart showing interrupt processing.

Figure 18A:
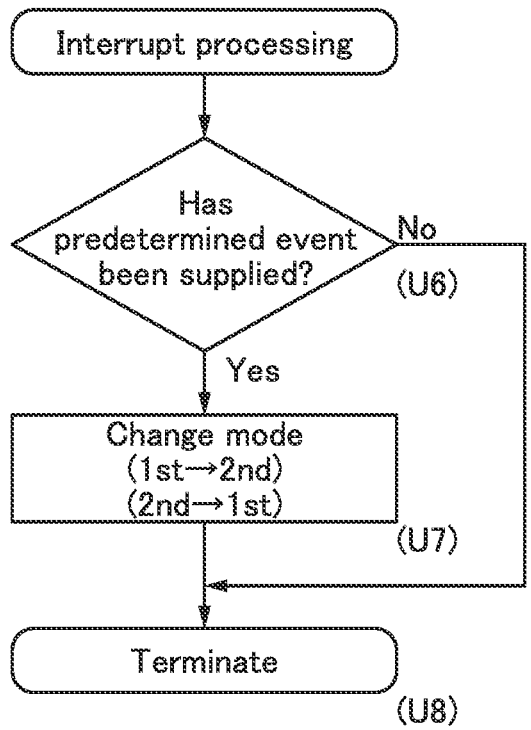
FIG. 18A to FIG. 18C are diagrams showing a driving method of a data processing device of one embodiment.
Figure 18B:
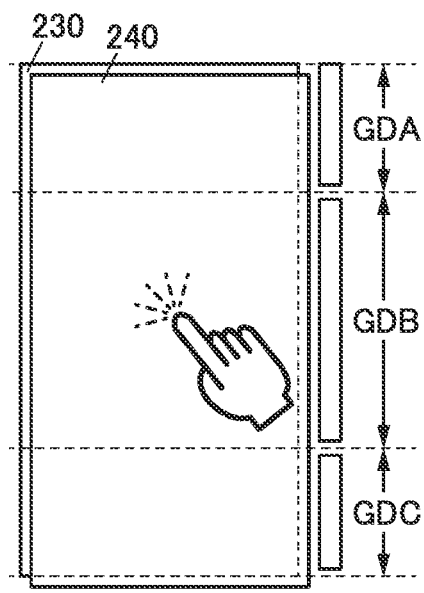
Figure 18C:
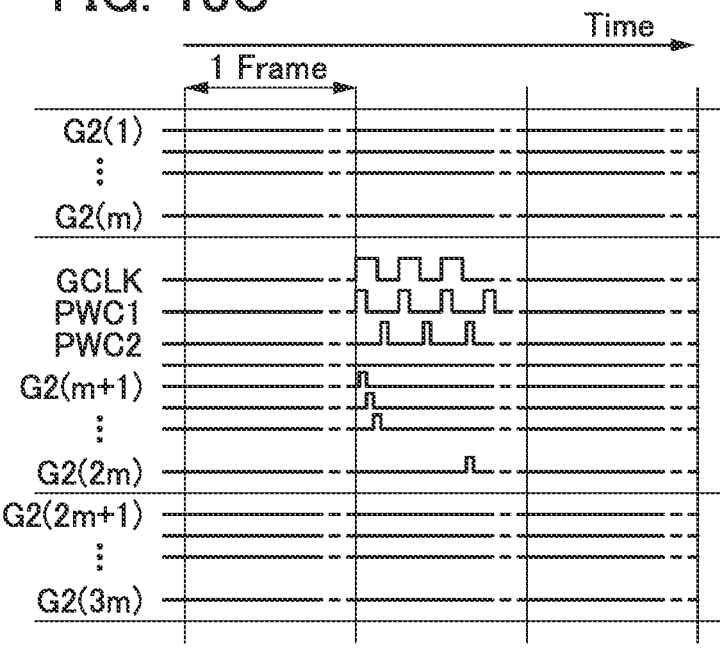

FIG. 18 are diagrams showing a program of one embodiment of the present invention. FIG. 18A is a flow chart showing interrupt processing of the program of one embodiment of the present invention. FIG. 18B is a schematic view illustrating operation of the data processing device, and FIG. 18C is a timing chart showing operation of the data processing device of one embodiment of the present invention.

Structure Example 1 of Data Processing Device

The data processing device described in this embodiment includes an arithmetic device 210 and an input/output device 220 (see FIG. 16A). Note that the input/output device 220 is electrically connected to the arithmetic device 210. A data processing device 200 can also include a housing (see FIG. 16B and FIG. 16C).

Structure Example 1 of Arithmetic Device 210

The arithmetic device 210 is supplied with input data II or sensing data DS. The arithmetic device 210 generates the control data CI and the image data VI on the basis of the input data II or the sensing data DS and supplies the control data CI and the image data VI.

The arithmetic device 210 includes an arithmetic portion 211 and a memory portion 212. The arithmetic device 210 includes a transmission path 214 and an input/output interface 215.

The transmission path 214 is electrically connected to the arithmetic portion 211, the memory portion 212, an artificial intelligence portion 213, and the input/output interface 215.
<<Arithmetic Portion 211>>

The arithmetic portion 211 has a function of executing a program, for example.
<<Memory Portion 212>>

The memory portion 212 has a function of storing, for example, the program executed by the arithmetic portion 211, initial data, setting data, or an image.

Specifically, a hard disk, a flash memory, a memory using a transistor including an oxide semiconductor, or the like can be used.
<<Input/Output Interface 215 and Transmission Path 214>>

The input/output interface 215 includes a terminal or a wiring and has a function of supplying data and being supplied with data. The input/output interface 215 can be electrically connected to the transmission path 214, for example. The input/output interface 215 can also be electrically connected to the input/output device 220.

The transmission path 214 includes a wiring and has a function of supplying data and being supplied with data. The transmission path 214 can be electrically connected to the input/output interface 215, for example. The transmission path 214 can also be electrically connected to the arithmetic portion 211, the memory portion 212, the artificial intelligence portion 213, and the input/output interface 215.

Structure Example of Input/Output Device 220

The input/output device 220 supplies the input data II and the sensing data DS. The input/output device 220 is supplied with the control data CI and the image data VI (see FIG. 16A).

As the input data II, for example, a scan code of a keyboard, positional data, operation data of buttons, sound data, or image data can be used. Alternatively, for example, illuminance data, attitude data, acceleration data, bearing data, pressure data, temperature data, humidity data, or the like of an environment where the data processing device 200 is used, or the like can be used as the sensing data DS.

As the control data CI, for example, a signal controlling the luminance of display of the image data VI, a signal controlling the color saturation, or a signal controlling the hue can be used. Alternatively, a signal that changes display of part of the image data VI can be used as the control data CI.

The input/output device 220 includes the display portion 230, the input portion 240, and the sensing portion 250. For example, the input/output device described in Embodiment 5 can be used.

Structure Example of Display Portion 230

The display portion 230 displays the image data VI on the basis of the control data CI.

The display portion 230 includes the control portion 238, the driver circuit GD, the driver circuit SD, and the display panel 700 (see FIG. 12). For example, the display device described in Embodiment 4 can be used for the display portion 230.

Structure Example of Input Portion 240

The input portion 240 generates the input data II. For example, the input portion 240 has a function of supplying positional data P1.

For example, a human interface or the like can be used for the input portion 240 (see FIG. 16A). Specifically, a keyboard, a mouse, a touch sensor, a microphone, a camera, or the like can be used as the input portion 240.

Moreover, a touch sensor including a region overlapping with the display portion 230 can be used. Note that an input/output device including the display portion 230 and a touch sensor including a region overlapping with the display portion 230 can be referred to as a touch panel or a touch screen.

A user can make various gestures (tap, drag, swipe, pinch in, and the like) using his/her finger touching the touch panel as a pointer, for example.

The arithmetic device 210, for example, analyzes data on the position, path, or the like of the finger in contact with the touch panel and can determine that a predetermined gesture is supplied when the analysis results meet predetermined conditions. Thus, the user can supply a predetermined operation instruction associated with the predetermined gesture in advance by using the gesture.

For instance, the user can supply a "scroll instruction" for changing the display position of image data by using a gesture of moving the finger in contact with the touch panel along the touch panel.

The user can supply a dragging instruction for pulling out and displaying a navigation panel NP at an edge portion of the display region 231, by using a gesture of moving a finger touching the edge portion of the display region 231 (see FIG. 16C). Moreover, the user can supply a leafing through instruction for displaying index images IND, some parts of other pages, or thumbnail images TN of other pages in an predetermined order on the navigation panel NP so that the user can flip through these images, by using a gesture of moving the position where a finger presses hard or by using the pressure of pressing the finger. Consequently, the user can turn the pages of an e-book like flipping through the pages of a paper book. Moreover, the user can search a given page with the aid of the thumbnail images TN or the index images IND.

Structure Example of Sensing Portion 250

The sensing portion 250 generates the sensing data DS. The sensing portion 250 has a function of sensing the illuminance of the environment where the data processing device 200 is used and a function of supplying illuminance data, for example.

The sensing portion 250 has a function of sensing the ambient conditions and supplying the sensing data. Specifically, the sensing portion 250 can supply illuminance data, attitude data, acceleration data, bearing data, pressure data, temperature data, humidity data, or the like.

For example, a photosensor, an attitude sensor, an acceleration sensor, a direction sensor, a GPS (Global positioning System) signal receiving circuit, a pressure-sensitive switch, a pressure sensor, a temperature sensor, a humidity sensor, a camera, or the like can be used as the sensing portion 250.

<<Communication Portion 290>>

A communication portion 290 has a function of supplying data to a network and obtaining data from the network.

<<Housing>>

Note that the housing has a function of storing the input/output device 220 or the arithmetic device 210. Alternatively, the housing has a function of supporting the display portion 230 or the arithmetic device 210.

Thus, the control data can be generated on the basis of the input data or the sensing data. Alternatively, the image data can be displayed on the basis of the input data or the sensing data. Alternatively, the data processing device can determine the intensity of light received by the housing of the data processing device and operate under the environment where the data processing device is used. Alternatively, a user of the data processing device can select a display method. As a result, a novel data processing device that is highly convenient or reliable can be provided.

Note that in some cases, these components cannot be clearly distinguished from each other and one component may also serve as another component or include part of another component. For example, a touch panel in which a touch sensor overlaps with a display panel is an input portion as well as a display portion.

Structure Example 2 of Arithmetic Device 210

The arithmetic device 210 includes the artificial intelligence portion 213 (see FIG. 16A).

The artificial intelligence portion 213 is supplied with the input data II or the sensing data DS, and the artificial intelligence portion 213 infers the control data CI on the basis of the input data II or the sensing data DS. Moreover, the artificial intelligence portion 213 supplies the control data CI.

In this manner, the control data CI for display that can be felt suitable can be generated. Alternatively, display that can be felt suitable is possible. Alternatively, the control data CI for display that can be felt comfortable can be generated. Alternatively, display that can be felt comfortable is possible. As a result, a novel data processing device that is highly convenient or reliable can be provided.

[Natural Language Processing on Input Data II]

Specifically, the artificial intelligence portion 213 can perform natural language processing on the input data II to extract one feature from the whole input data II. For example, the artificial intelligence portion 213 can infer emotion or the like put in the input data II, which can be a feature. The artificial intelligence portion 213 can infer the color, design, font, or the like empirically felt suitable for the feature. The artificial intelligence portion 213 can generate data specifying the color, design, or font of a letter or data specifying the color or design of the background, and the data can be used as the control data CI.

Specifically, the artificial intelligence portion 213 can perform natural language processing on the input data II to extract some words included in the input data II. For example, the artificial intelligence portion 213 can extract expressions including a grammatical error, a factual error, emotion, and the like. The artificial intelligence portion 213 can generate data for display of extracted part in the color, design, font, or the like different from those of another part, and the data can be used as the control data CI.

[Image Processing on Input Data II]

Specifically, the artificial intelligence portion 213 can perform image processing on the input data II to extract one feature from the input data II. For example, the artificial intelligence portion 213 can infer the age where an image of the input data II is taken, whether the image is taken indoors or outdoors, whether the image is taken in the daytime or at night, or the like, which can be a feature. The artificial intelligence portion 213 can infer the color tone empirically felt suitable for the feature and generate the control data CI for use of the color tone for display. Specifically, data specifying color (e.g., full color, monochrome, or sepia) used for expression of a gradation can be used as the control data CI.

Specifically, the artificial intelligence portion 213 can perform image processing on the input data II to extract some images included in the input data II. For example, the artificial intelligence portion 213 can generate the control data CI for display of a boundary between extracted part of the image and another part. Specifically, the artificial intelligence portion 213 can generate the control data CI for display of a rectangle surrounding the extracted part of the image.

[Inference Using Sensing Data DS]

Specifically, the artificial intelligence portion 213 can generate an inference using the sensing data DS. Alternatively, the artificial intelligence portion 213 can generate the control data CI on the basis of inference so that the user of the data processing device 200 can feel comfortable.

Specifically, the artificial intelligence portion 213 can generate the control data CI for adjustment of display brightness on the basis of the ambient illuminance or the like so that the display brightness can be felt comfortable. Alternatively, the artificial intelligence portion 213 can generate the control data CI for adjustment of volume on the basis of the ambient noise or the like so that the volume can be felt comfortable.

As the control data CI, a clock signal, a timing signal, or the like that is supplied to the control portion 238 included in the display portion 230 can be used. Alternatively, a clock signal, a timing signal, or the like that is supplied to a control portion 248 included in the input portion 240 can be used as the control data CI.

Structure Example 2 of Data Processing Device

Another structure of the data processing device of one embodiment of the present invention is described with reference to FIG. 17A and FIG. 17B.

<<Program>>

A program of one embodiment of the present invention has the following steps (see FIG. 17A).

[First Step]

In a first step, setting is initialized (see (S1) in FIG. 17A).

For example, predetermined image data which is to be displayed on start-up and data for determining a predetermined mode of displaying the image data and a predetermined display method for displaying the image data are acquired from the memory portion 212. Specifically, one still image data or another moving image data can be used as the predetermined image data. Furthermore, a first mode or a second mode can be used as the predetermined mode.
[Second Step]

In a second step, interrupt processing is allowed (see (S2) in FIG. 17A). Note that an arithmetic device allowed to execute the interrupt processing can perform the interrupt processing in parallel with the main processing. The arithmetic device that has returned from the interrupt processing to the main processing can reflect the results obtained through the interrupt processing in the main processing.

The arithmetic device may execute the interrupt processing when a counter has an initial value, and the counter may be set at a value other than the initial value when the arithmetic device returns from the interrupt processing. Thus, the interrupt processing can always follow the start-up of the program.
[Third Step]

In a third step, image data is displayed by a predetermined mode or a predetermined display method selected in the first step or the interrupt processing (see (S3) in FIG. 17A). Note that the predetermined mode determines a mode of displaying the data, and the predetermined display method determines a method for displaying the image data. For example, the image data VI can be used as data to be displayed.

One method for displaying the image data VI can be associated with the first mode, for example. Alternatively, another method for displaying the image data VI can be associated with the second mode. Thus, a display method can be selected on the basis of the selected mode.
<<First Mode>>

Specifically, a method for supplying selection signals to a scan line at a frequency of 30 Hz or higher, preferably 60 Hz or higher, and performing display on the basis of the selection signals can be associated with the first mode.

For example, when selection signals are supplied at a frequency of 30 Hz or higher, preferably 60 Hz or higher, the movement of a moving image can be smoothly displayed.

For example, when an image is refreshed at a frequency of 30 Hz or higher, preferably 60 Hz or higher, an image that changes so as to smoothly follow the user's operation can be displayed on the data processing device 200 which is being operated by the user.
<<Second Mode>>

Specifically, a method for supplying selection signals to a scan line at a frequency lower than 30 Hz, preferably lower than 1 Hz, further preferably less than once a minute, and performing display on the basis of the selection signals can be associated with the second mode.

The supply of selection signals at a frequency lower than 30 Hz, preferably lower than 1 Hz, further preferably less than once a minute enables display with a flicker or flickering suppressed. Furthermore, the power consumption can be reduced.

For example, when the data processing device 200 is used for a clock, the display can be refreshed at a frequency of once a second, once a minute, or the like.

Note that when a light-emitting element is used as the display element, for example, the light-emitting element can be made to emit light in a pulsed manner so that image data is displayed. Specifically, an organic EL element can be made to emit light in a pulsed manner, and its afterglow can be used for display. The organic EL element has excellent frequency characteristics; thus, time for driving the light-emitting element can be shortened, and thus the power consumption can be reduced in some cases. Alternatively, heat generation is inhibited; thus, the deterioration of the light-emitting element can be suppressed in some cases.
[Fourth Step]

In a fourth step, selection is performed such that the program proceeds to a fifth step when a termination instruction has been supplied, whereas the program proceeds to the third step when the termination instruction has not been supplied (see (S4) in FIG. 17A).

For example, the termination instruction supplied in the interrupt processing may be used for the determination.
[Fifth Step]

In the fifth step, the program terminates (see (S5) in FIG. 17A).
<<Interrupt Processing>>

The interrupt processing includes a sixth step to an eighth step described below (see FIG. 17B).
[Sixth Step]

In the sixth step, the illuminance of the environment where the data processing device 200 is used is sensed using the sensing portion 250, for example (see (S6) in FIG. 17B). Note that color temperature or chromaticity of ambient light may be sensed instead of the illuminance of the environment.
[Seventh Step]

In the seventh step, a display method is determined on the basis of the sensed illuminance data (see (S7) in FIG. 17B). For example, a display method is determined such that the brightness of display is not too dark or too bright.

Note that in the case where the color temperature of the ambient light or the chromaticity of the ambient light is sensed in the sixth step, the color of display may be adjusted.
[Eighth Step]

In the eighth step, the interrupt processing terminates (see (S8) in FIG. 17B).

Structure Example 3 of Data Processing Device

Another structure of the data processing device of one embodiment of the present invention is described with reference to FIG. 18.

FIG. 18A is a flow chart showing a program of one embodiment of the present invention. FIG. 18A is a flow chart showing interrupt processing different from the interrupt processing shown in FIG. 17B.

Note that the structure example 3 of the data processing device is different from the interrupt processing described with reference to FIG. 17B in that the interrupt processing includes a step of changing a mode on the basis of a supplied predetermined event. Different portions will be described in detail here, and refer to the above description for portions that can use similar structures.
<<Interrupt Processing>>

The interrupt processing includes a sixth step to an eighth step described below (see FIG. 18A).
[Sixth Step]

In the sixth step, the program proceeds to the seventh step when a predetermined event has been supplied, whereas the program proceeds to the eighth step when the predetermined event has not been supplied (see (U6) in FIG. 18A). For example, whether the predetermined event is supplied in a predetermined period or not can be used as a condition. Specifically, the predetermined period can be longer than 0 seconds, and shorter than or equal to 5 seconds, shorter than or equal to 1 second, or shorter than or equal to 0.5 seconds, preferably shorter than or equal to 0.1 seconds.

[Seventh Step]

In the seventh step, the mode is changed (see (U7) in FIG. 18A). Specifically, the second mode is selected in the case where the first mode has been selected, and the first mode is selected in the case where the second mode has been selected.

For example, it is possible to change the display mode of a region that is part of the display portion 230. Specifically, the display mode of a region where one driver circuit in the display portion 230 including the driver circuit GDA, the driver circuit GDB, and a driver circuit GDC supplies a selection signal can be changed (see FIG. 18B).

For example, the display mode of the region where a selection signal is supplied from the driver circuit GDB can be changed when a predetermined event is supplied to the input portion 240 in a region overlapping with the region where a selection signal is supplied from the driver circuit GDB (see FIG. 18B and FIG. 18C). Specifically, the frequency of supply of the selection signal from the driver circuit GDB can be changed in accordance with a "tap" event supplied to a touch panel with a finger or the like.

A signal GCLK is a clock signal controlling the operation of the driver circuit GDB, and a signal PWC1 and a signal PWC2 are pulse width control signals controlling the operation of the driver circuit GDB. The driver circuit GDB supplies selection signals to a scan line G2(m+1) to a scan line G2(2m) on the basis of the signal GCLK, the signal PWC1, the signal PWC2, and the like.

Thus, for example, the driver circuit GDB can supply a selection signal without supply of selection signals from the driver circuit GDA and the driver circuit GDC. Alternatively, the display of the region where a selection signal is supplied from the driver circuit GDB can be refreshed without any change in the display of regions where selection signals are supplied from the driver circuit GDA and the driver circuit GDC. Alternatively, power consumed by the driver circuits can be reduced.

[Eighth Step]

In the eighth step, the interrupt processing terminates (see (U8) in FIG. 18A). Note that in a period in which the main processing is executed, the interrupt processing may be repeatedly executed.

<<Predetermined Event>>

For example, it is possible to use events supplied using a pointing device such as a mouse, such as "click" and "drag", and events supplied to a touch panel with a finger or the like used as a pointer, such as "tap", "drag", and "swipe".

For example, the position of a slide bar pointed by a pointer, the swipe speed, and the drag speed can be used to assign arguments to an instruction associated with a predetermined event.

For example, data sensed by the sensing portion 250 is compared with a predetermined threshold value, and the compared results can be used for the event.

Specifically, a pressure sensor or the like in contact with a button or the like that is arranged so as to be pushed in a housing can be used for the sensing portion 250.

<<Instruction Associated with Predetermined Event>>

For example, the termination instruction can be associated with a predetermined event.

For example, "page-turning instruction" for switching display from one displayed image data to another image data can be associated with a predetermined event. Note that an argument determining the page-turning speed or the like, which is used when the "page-turning instruction" is executed, can be supplied using the predetermined event.

For example, "scroll instruction" for moving the display position of displayed part of image data and displaying another part continuing from that part, or the like can be associated with a predetermined event. Note that an argument determining the moving speed of display, or the like, which is used when the "scroll instruction" is executed, can be supplied using the predetermined event.

For example, an instruction for setting the display method, an instruction for generating image data, or the like can be associated with a predetermined event. Note that an argument determining the brightness of a generated image can be associated with a predetermined event. An argument determining the brightness of a generated image may be determined on the basis of ambient brightness sensed by the sensing portion 250.

For example, an instruction for acquiring data distributed via a push service using the communication portion 290 or the like can be associated with a predetermined event.

Note that positional data sensed by the sensing portion 250 may be used for the determination of the presence or absence of a qualification for acquiring data. Specifically, it may be determined that there is a qualification for acquiring data in the case of presence in a predetermined class room, school, conference room, company, building, or the like or in a predetermined region. Thus, for example, educational materials distributed in a classroom of a school, a university, or the like can be received, so that the data processing device 200 can be used as a schoolbook or the like (see FIG. 16C). Alternatively, materials distributed in a conference room in, for example, a company can be received and used for a conference material.

Note that this embodiment can be combined with other embodiments in this specification as appropriate.

Embodiment 7

In this embodiment, a structure of a data processing device of one embodiment of the present invention will be described with reference to FIG. 19 to FIG. 21.

Figure 19A:
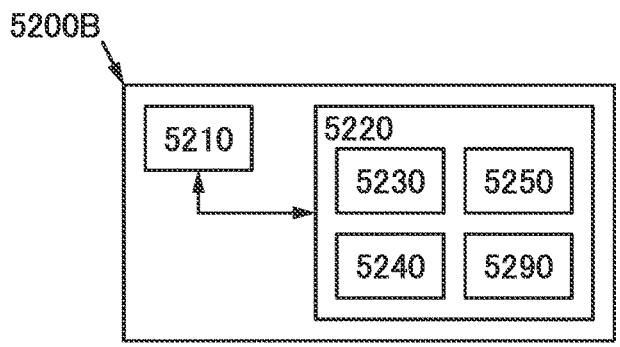
FIG. 19A to FIG. 19E are diagrams each illustrating a structure of a data processing device of one embodiment.
Figure 19B:
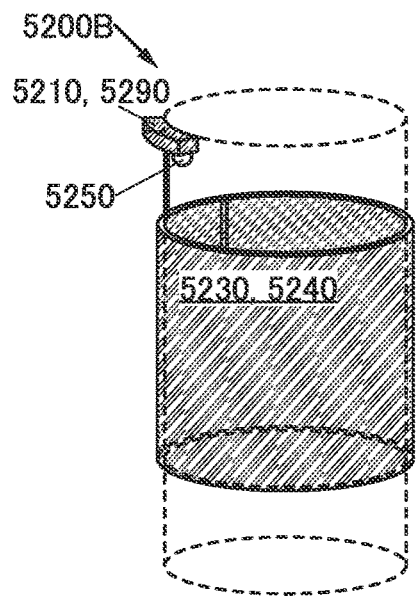
Figure 19C:
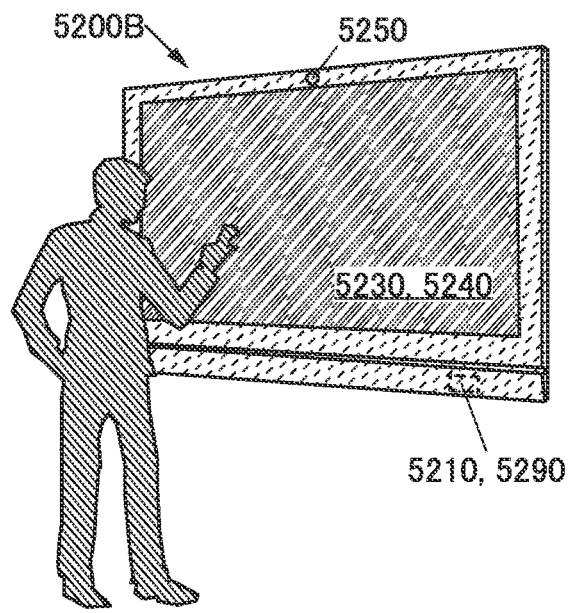
Figure 19D:
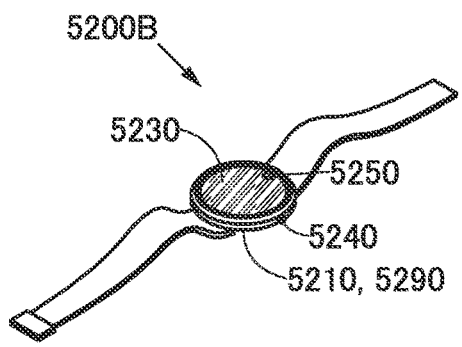
Figure 19E:
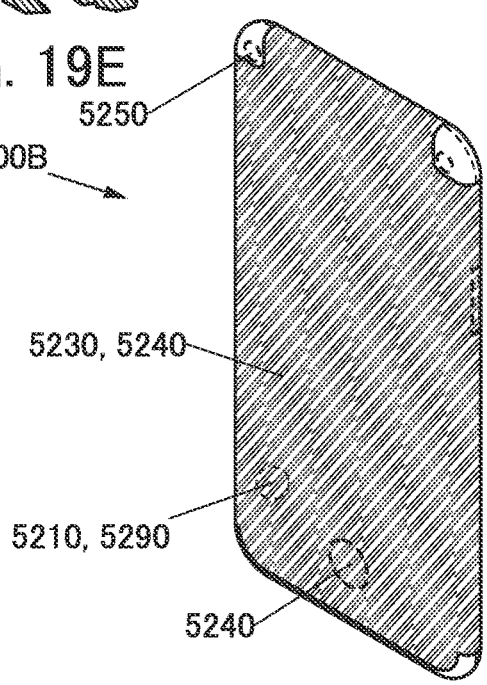
Figure 20A:
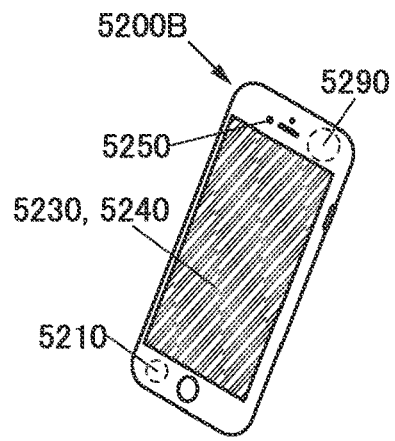
FIG. 20A to FIG. 20E are diagrams each illustrating a structure of a data processing device of one embodiment.
Figure 20B:
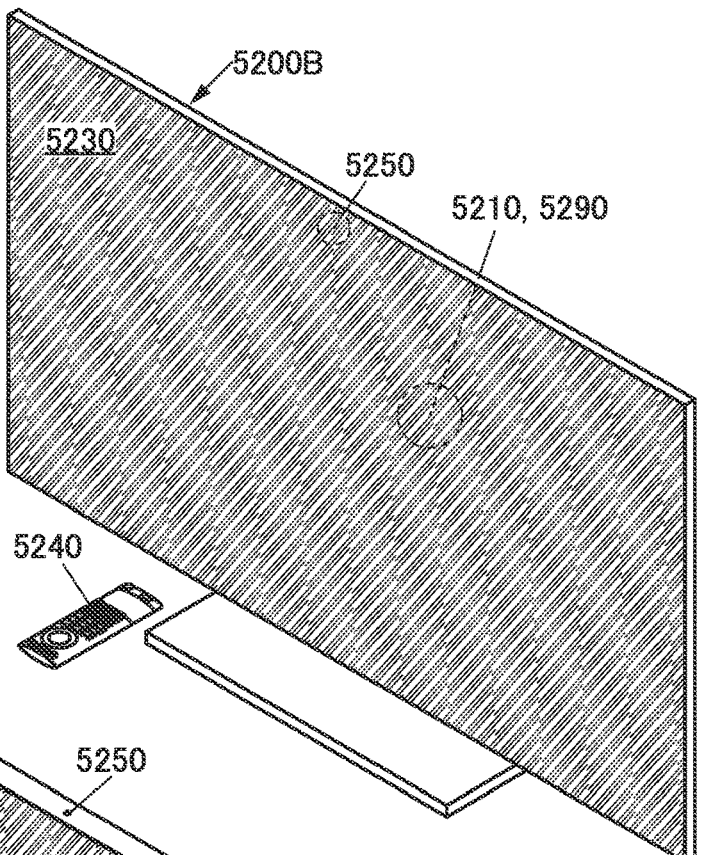
Figure 20C:
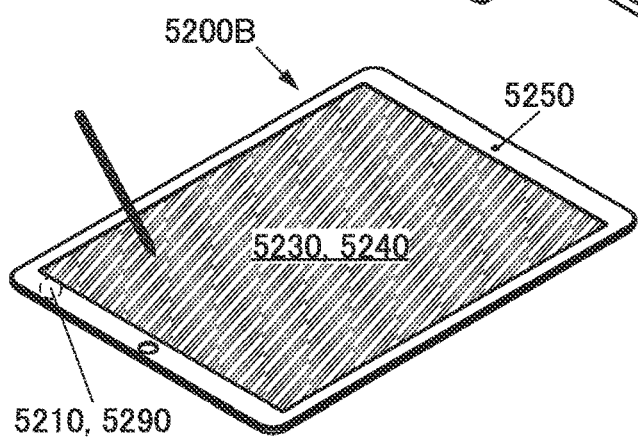
Figure 20D:
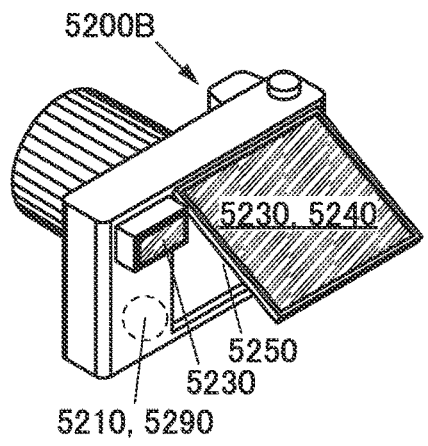
Figure 20E:
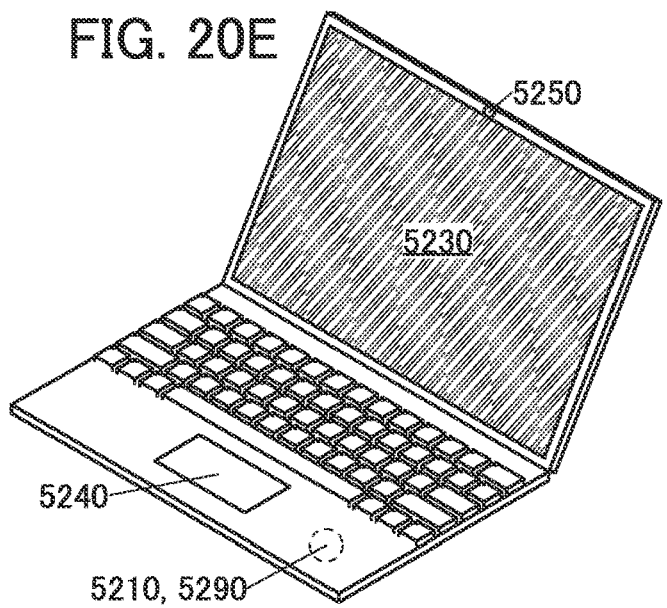
Figure 21A:
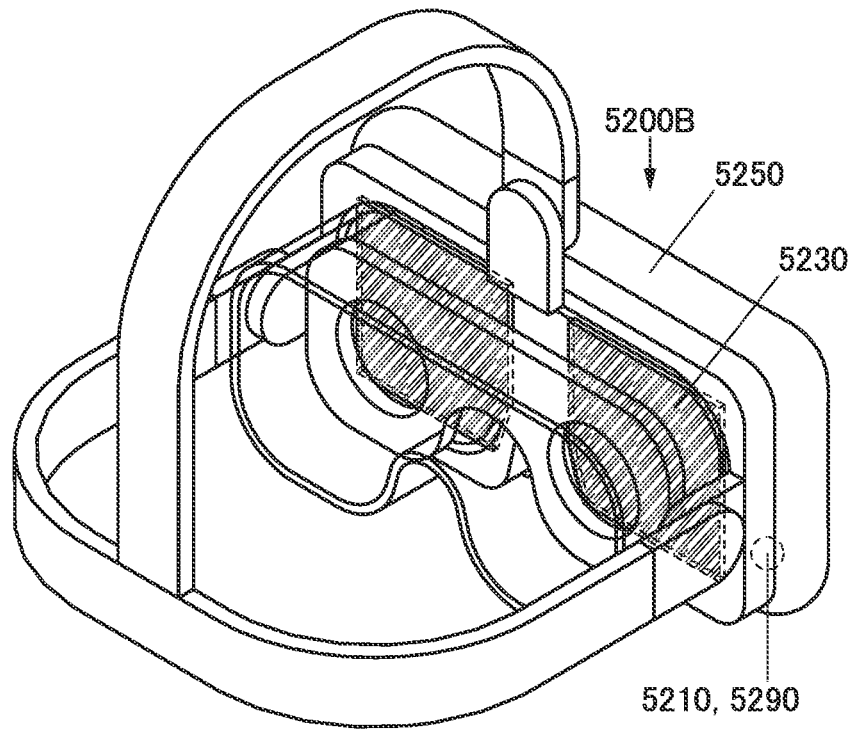
FIG. 21A and FIG. 21B are diagrams each illustrating a structure of a data processing device of one embodiment.
Figure 21B:
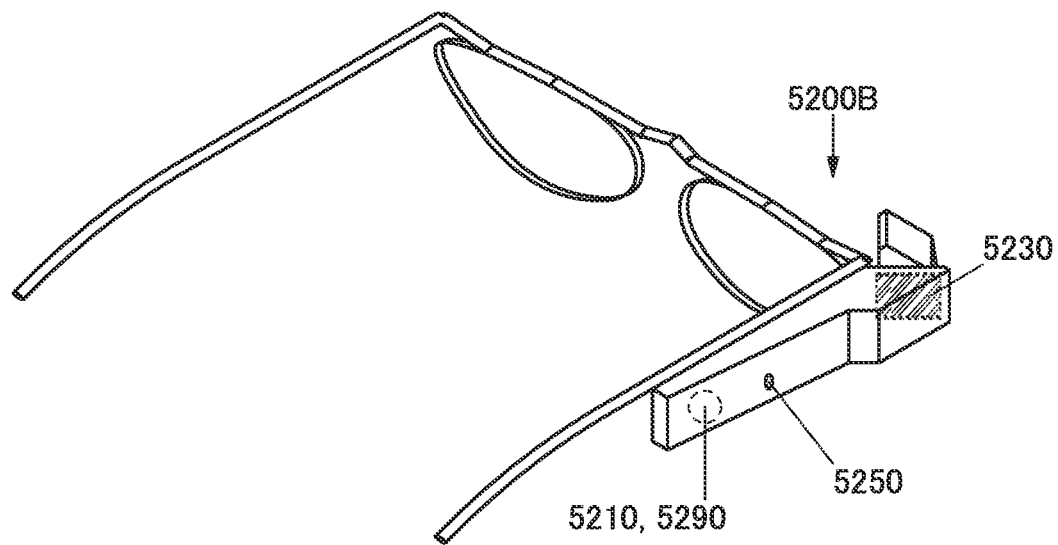

FIG. 19 to FIG. 21 are diagrams illustrating structures of the data processing device of one embodiment of the present invention. FIG. 19A is a block diagram of the data processing device, and FIG. 19B to FIG. 19E are perspective views illustrating structures of the data processing device. In addition, FIG. 20A to FIG. 20E are perspective views illustrating structures of the data processing device. In addition, FIG. 21A and FIG. 21B are perspective views illustrating structures of the data processing device.

<Data Processing Device>

A data processing device 5200B described in this embodiment includes an arithmetic device 5210 and an input/output device 5220 (see FIG. 19A).

The arithmetic device 5210 has a function of being supplied with operation data and a function of supplying image data on the basis of the operation data.

The input/output device 5220 includes a display portion 5230, an input portion 5240, a sensing portion 5250, and a communication portion 5290 and has a function of supplying operation data and a function of being supplied with image data. The input/output device 5220 also has a function of supplying sensing data, a function of supplying communication data, and a function of being supplied with communication data.

The input portion 5240 has a function of supplying operation data. For example, the input portion 5240 supplies operation data on the basis of operation by a user of the data processing device 5200B.

Specifically, a keyboard, a hardware button, a pointing device, a touch sensor, an illuminance sensor, an imaging device, an audio input device, an eye-gaze input device, an attitude detection device, or the like can be used as the input portion 5240.

The display portion 5230 includes a display panel and has a function of displaying image data. For example, the display panel described in Embodiment 1 or Embodiment 3 can be used for the display portion 5230.

The sensing portion 5250 has a function of supplying sensing data. For example, the sensing portion 5250 has a function of sensing a surrounding environment where the data processing device is used and supplying sensing data.

Specifically, an illuminance sensor, an imaging device, an attitude detection device, a pressure sensor, a human motion sensor, or the like can be used as the sensing portion 5250.

The communication portion 5290 has a function of being supplied with communication data and a function of supplying communication data. For example, the communication portion 5290 has a function of being connected to another electronic device or a communication network through wireless communication or wired communication. Specifically, the communication portion 5290 has a function of wireless local area network communication, telephone communication, near field communication, or the like.

Structure Example 1 of Data Processing Device

For example, the display portion 5230 can have an outer shape along a cylindrical column or the like (see FIG. 19B). In addition, the data processing device has a function of changing its display method in accordance with the illuminance of a usage environment. Furthermore, the data processing device has a function of changing displayed content in response to sensed existence of a person. This allows the data processing device to be provided on a column of a building, for example. The data processing device can display advertising, guidance, or the like. The data processing device can be used for digital signage or the like.

Structure Example 2 of Data Processing Device

For example, the data processing device has a function of generating image data on the basis of the path of a pointer used by a user (see FIG. 19C). Specifically, the display panel with a diagonal size of 20 inches or longer, preferably 40 inches or longer, further preferably 55 inches or longer can be used. Alternatively, a plurality of display panels can be arranged and used as one display region. Alternatively, a plurality of display panels can be arranged and used as a multiscreen. Thus, the data processing device can be used for an electronic blackboard, an electronic bulletin board, digital signage, or the like.

Structure Example 3 of Data Processing Device

The data processing device can receive data from another device, and the data can be displayed on the display portion 5230 (see FIG. 19D). Several options can be displayed. The user can choose some from the options and send a reply to a transmitter of the data. For example, the data processing device has a function of changing its display method in accordance with the illuminance of a usage environment. Thus, for example, the power consumption of a smartwatch can be reduced. Alternatively, for example, a smartwatch can display an image so as to be suitably used even in an environment under strong external light, e.g., outdoors in fine weather.

Structure Example 4 of Data Processing Device

For example, the display portion 5230 has a surface gently curved along a side surface of a housing (see FIG. 19E). The display portion 5230 includes a display panel, and the display panel has a function of performing display on the front surface, the side surfaces, the top surface, and the rear surface, for example. Thus, for example, a mobile phone can display data not only on its front surface but also on its side surfaces, its top surface, and its rear surface.

Structure Example 5 of Data Processing Device

For example, the data processing device can receive data via the Internet and display the data on the display portion 5230 (see FIG. 20A). A created message can be checked on the display portion 5230. The created message can be sent to another device. The data processing device has a function of changing its display method in accordance with the illuminance of a usage environment, for example. Thus, the power consumption of a smartphone can be reduced. Alternatively, for example, a smartphone can display an image so as to be suitably used even in an environment under strong external light, e.g., outdoors in fine weather.

Structure Example 6 of Data Processing Device

A remote controller can be used as the input portion 5240 (see FIG. 20B). For example, the data processing device can receive data from a broadcast station or via the Internet and display the data on the display portion 5230. An image of a user can be captured using the sensing portion 5250. The image of the user can be transmitted. The data processing device can acquire a viewing history of the user and provide it to a cloud service. The data processing device can acquire recommendation data from a cloud service and display the data on the display portion 5230. A program or a moving image can be displayed on the basis of the recommendation data. For example, the data processing device has a function of changing its display method in accordance with the illuminance of a usage environment. Accordingly, for example, a television system can display an image to be suitably used even when irradiated with strong external light that enters a room in fine weather.

Structure Example 7 of Data Processing Device

For example, the data processing device can receive educational materials via the Internet and display them on the display portion 5230 (see FIG. 20C). An assignment can be input with the input portion 5240 and sent via the Internet. A corrected assignment or the evaluation of the assignment can be obtained from a cloud service and displayed on the display portion 5230. Suitable educational materials can be selected on the basis of the evaluation and displayed.

For example, the display portion 5230 can perform display using an image signal received from another data processing device. When the data processing device is placed on a stand or the like, the display portion 5230 can be used as a sub-display. Thus, for example, a tablet computer can display an image to be suitably used even in an environment under strong external light, e.g., outdoors in fine weather.

Structure Example 8 of Data Processing Device

The data processing device includes, for example, a plurality of display portions 5230 (see FIG. 20D). For example, the display portion 5230 can display an image that the sensing portion 5250 is capturing. A captured image can be displayed on the sensing portion. A captured image can be decorated using the input portion 5240. A message can be attached to a captured image. A captured image can be transmitted via the Internet. The data processing device has a function of changing its shooting conditions in accordance with the illuminance of a usage environment. Accordingly, for example, a digital camera can display a subject in such a manner that an image is favorably viewed even in an environment under strong external light, e.g., outdoors in fine weather.

Structure Example 9 of Data Processing Device

For example, the data processing device of this embodiment is used as a master and another data processing device is used as a slave, whereby the other data processing device can be controlled (see FIG. 20E). As another example, part of image data can be displayed on the display portion 5230 and another part of the image data can be displayed on a display portion of another data processing device. Image signals can be supplied. With the communication portion 5290, data to be written can be obtained from an input portion of another data processing device. Thus, a large display region can be utilized by using a portable personal computer, for example.

Structure Example 10 of Data Processing Device

The data processing device includes, for example, the sensing portion 5250 that senses an acceleration or a direction (see FIG. 21A). The sensing portion 5250 can supply data on the position of the user or the direction in which the user faces. The data processing device can generate image data for the right eye and image data for the left eye in accordance with the position of the user or the direction in which the user faces. The display portion 5230 includes a display region for the right eye and a display region for the left eye. Thus, a virtual reality image that gives the user a sense of immersion can be displayed on a goggles-type data processing device, for example.

Structure Example 11 of Data Processing Device

The data processing device includes, for example, an imaging device and the sensing portion 5250 that senses an acceleration or a direction (see FIG. 21B). The sensing portion 5250 can supply data on the position of the user or the direction in which the user faces. The data processing device can generate image data in accordance with the position of the user or the direction in which the user faces. Accordingly, the data can be shown together with a real-world scene, for example. An augmented reality image can be displayed on a glasses-type data processing device.

Note that this embodiment can be combined with other embodiments in this specification as appropriate.

In the case where there is an explicit description, X and Y are connected, in this specification and the like, for example, the case where X and Y are electrically connected, the case where X and Y are functionally connected, and the case where X and Y are directly connected are disclosed in this specification and the like. Accordingly, without being limited to a predetermined connection relationship, for example, a connection relationship shown in drawings or texts, a connection relationship other than one shown in drawings or texts is regarded as being disclosed in the drawings or the texts.

Here, X and Y each denote an object (e.g., a device, an element, a circuit, a wiring, an electrode, a terminal, a conductive film, or a layer).

Examples of the case where X and Y are directly connected include the case where an element that allows an electrical connection between X and Y (e.g., a switch, a transistor, a capacitor, an inductor, a resistor, a diode, a display element, a light-emitting element, and a load) is not connected between X and Y, and the case where X and Y are connected without the element that allows the electrical connection between X and Y (e.g., a switch, a transistor, a capacitor, an inductor, a resistor, a diode, a display element, a light-emitting element, and a load) provided therebetween.

For example, in the case where X and Y are electrically connected, one or more elements that allow an electrical connection between X and Y (e.g., a switch, a transistor, a capacitor, an inductor, a resistor, a diode, a display element, a light-emitting element, and a load) can be connected between X and Y. Note that a switch has a function of being controlled to be turned on or off. That is, a switch has a function of being in a conduction state (on state) or a non-conduction state (off state) to control whether or not current flows. Alternatively, the switch has a function of selecting and changing a current path. Note that the case where X and Y are electrically connected includes the case where X and Y are directly connected.

An example of the case where X and Y are functionally connected is the case where one or more circuits that allow functional connection between X and Y (for example, a logic circuit (an inverter, a NAND circuit, a NOR circuit, or the like), a signal converter circuit (a DA converter circuit, an AD converter circuit, a gamma correction circuit, or the like), a potential level converter circuit (a power supply circuit (for example, a step-up circuit, a step-down circuit, or the like), a level shifter circuit for changing the potential level of a signal, or the like), a voltage source, a current source, a switching circuit, an amplifier circuit (a circuit capable of increasing signal amplitude, the amount of current, or the like, an operational amplifier, a differential amplifier circuit, a source follower circuit, a buffer circuit, or the like), a signal generator circuit, a memory circuit, a control circuit, or the like) can be connected between X and Y. For example, even when another circuit is interposed between X and Y, X and Y are functionally connected when a signal output from X is transmitted to Y. Note that the case where X and Y are functionally connected includes the case where X and Y are directly connected and the case where X and Y are electrically connected.

Note that in the case where there is an explicit description, X and Y are electrically connected, the case where X and Y are electrically connected (i.e., the case where X and Y are connected with another element or another circuit provided therebetween), the case where X and Y are functionally connected (i.e., the case where X and Y are functionally connected with another circuit provided therebetween), and the case where X and Y are directly connected (i.e., the case where X and Y are connected without another element or another circuit provided therebetween) are disclosed in this specification and the like. That is, in the case where there is an explicit description, being electrically connected, the same contents as the case where there is only an explicit description, being connected, are disclosed in this specification and the like.

Note that, for example, the case where a source (or a first terminal or the like) of a transistor is electrically connected to X through (or not through) Z1 and a drain (or a second terminal or the like) of the transistor is electrically connected to Y through (or not through) Z2, or the case where a source (or a first terminal or the like) of a transistor is directly connected to one part of Z1 and another part of Z1 is directly connected to X while a drain (or a second terminal or the like) of the transistor is directly connected to one part of Z2 and another part of Z2 is directly connected to Y can be expressed as follows.

It can be expressed as, for example, "X, Y, a source (or a first terminal or the like) of a transistor, and a drain (or a second terminal or the like) of the transistor are electrically connected to each other, and X, the source (or the first terminal or the like) of the transistor, the drain (or the second terminal or the like) of the transistor, and Y are electrically connected to each other in this order". Alternatively, the expression "a source (or a first terminal or the like) of a transistor is electrically connected to X, a drain (or a second terminal or the like) of the transistor is electrically connected to Y, and X, the source (or the first terminal or the like) of the transistor, the drain (or the second terminal or the like) of the transistor, and Y are electrically connected to each other in this order" can be used. Alternatively, the expression "X is electrically connected to Y through a source (or a first terminal or the like) and a drain (or a second terminal or the like) of a transistor, and X, the source (or the first terminal or the like) of the transistor, the drain (or the second terminal or the like) of the transistor, and Y are provided in this connection order" can be used. When the connection order in a circuit structure is defined by an expression similar to the above examples, a source (or a first terminal or the like) and a drain (or a second terminal or the like) of a transistor can be distinguished from each other to specify the technical scope.

Other examples of the expressions include, "a source (or a first terminal or the like) of a transistor is electrically connected to X through at least a first connection path, the first connection path does not include a second connection path, the second connection path is a path through the transistor and between the source (or the first terminal or the like) of the transistor and a drain (or a second terminal or the like) of the transistor, the first connection path is a path through Z1, the drain (or the second terminal or the like) of the transistor is electrically connected to Y through at least a third connection path, the third connection path does not include the second connection path, and the third connection path is a path through Z2" and "a source (or a first terminal or the like) of a transistor is electrically connected to X through Z1 by at least a first connection path, the first connection path does not include a second connection path, the second connection path includes a connection path through the transistor, a drain (or a second terminal or the like) of the transistor is electrically connected to Y through Z2 by at least a third connection path, and the third connection path does not include the second connection path". Alternatively, the expression "a source (or a first terminal or the like) of a transistor is electrically connected to X by at least a first electrical path through Z1, the first electrical path does not include a second electrical path, the second electrical path is an electrical path from the source (or the first terminal or the like) of the transistor to a drain (or a second terminal or the like) of the transistor, the drain (or the second terminal or the like) of the transistor is electrically connected to Y by at least a third electrical path through Z2, the third electrical path does not include a fourth electrical path, and the fourth electrical path is an electrical path from the drain (or the second terminal or the like) of the transistor to the source (or the first terminal or the like) of the transistor" can be used. When the connection path in a circuit structure is defined by an expression similar to the above examples, a source (or a first terminal or the like) and a drain (or a second terminal or the like) of a transistor can be distinguished from each other to specify the technical scope.

Note that these expressions are examples and the expression is not limited to these expressions. Here, X, Y, Z1, and Z2 denote an object (e.g., a device, an element, a circuit, a wiring, an electrode, a terminal, a conductive film, and a layer).

Even when independent components are electrically connected to each other in a circuit diagram, one component has functions of a plurality of components in some cases. For example, when part of a wiring also functions as an electrode, one conductive film has functions of both components: a function of the wiring and a function of the electrode. Thus, "electrical connection" in this specification includes in its category such a case where one conductive film has functions of a plurality of components.

REFERENCE NUMERALS

ANO: conductive film, C21: capacitor, C22: capacitor, CI: control data, DS: sensing data, FPC1: flexible printed circuit, GCLK: signal, G(s): scan line, G2: scan line, II: input data, KB1: structure body, N1$(i,j)$: node, N2$(i,j)$: node, P1: positional data, PWC1: signal, PWC2: signal, S1$(j)$: signal line, SP: control signal, SW21: switch, SW22: switch, SW23: switch, SW24: switch, VO: conductive film, V11: data, VI: image data, VCOM2: conductive film, 30: resist, 200: data processing device, 210: arithmetic device, 211: arithmetic portion, 212: memory portion, 213: artificial intelligence portion, 214: transmission path, 215: input/output interface, 220: input/output device, 230: display portion, 231: display region, 233: control circuit, 234: decompression circuit, 235: image processing circuit, 238: control circuit, 240: input portion, 241: sensing region, 248: control portion, 249: component, 250: sensing portion, 290: communication portion, 501C: insulating film, 501D: insulating film, 504: conductive film, 506: insulating film, 508: semiconductor film, 508A: region, 508B: region, 508C: region, 510: base material, 512A: conductive film, 512B: conductive film, 516: insulating film, 518: insulating film, 519B: terminal, 520: functional layer, 521: insulating film, 524: conductive film, 528: insulating film, 530$(i,j)$: pixel circuit, 550$(i,j)$: display element, 551$(i,j)$: electrode, 551A: conductive film, 552: electrode, 552H: opening portion, 553: layer containing a light-emitting material, 554: auxiliary wiring, 573: insulating film, 573A: insulating film, 573B: insulating film, 573H: opening portion, 574: conductive film, 575: insulating film, 591A: opening portion, 700: display panel, 700TP: input/output panel, 702$(i,j)$: pixel, 703: pixel, 705: sealant, 720: functional layer, 770: base material, 770P: functional film, 771: insulating film, 775: sensing element, 5200B: data processing device, 5210: arithmetic device, 5220: input/output device, 5230: display portion, 5240: input portion, 5250: sensing portion, 5290: communication portion

The invention claimed is:

1. A display panel comprising:
a display region;
a functional layer;
a first insulating film; and
a first conductive film,
wherein the display region comprises a pixel,
wherein the pixel comprises a display element and a pixel circuit,
wherein the display element comprises a region sandwiched between the first insulating film and the functional layer,
wherein the display element comprises a first electrode and a second electrode,
wherein the first electrode comprises a region sandwiched between the second electrode and the functional layer,
wherein the second electrode comprises a first opening portion,
wherein the functional layer comprises the pixel circuit, a second opening portion, and an auxiliary wiring,
wherein the pixel circuit is electrically connected to the display element in the second opening portion,
wherein the auxiliary wiring comprises a region overlapping with the first opening portion,
wherein the first insulating film comprises a third opening portion,
wherein the first insulating film comprises a region sandwiched between the first conductive film and the second electrode,
wherein the third opening portion comprises a region overlapping with the first opening portion, and
wherein the first conductive film is electrically connected to the second electrode and the auxiliary wiring in the third opening portion.

2. The display panel according to claim 1,
wherein the first conductive film has a light-transmitting property, and
wherein the second electrode has a light-transmitting property.

3. The display panel according to claim 1,
further comprising a second insulating film,
wherein the first conductive film comprises a region sandwiched between the second insulating film and the auxiliary wiring, and
wherein the second insulating film has a light-transmitting property.

4. The display panel according to claim 1,
wherein the first opening portion has a smaller area than the third opening portion, and
wherein the first conductive film is electrically connected to the second electrode at a peripheral edge of the first opening portion.

5. The display panel according to claim 1,
wherein the first electrode comprises a second conductive film, and
wherein the auxiliary wiring comprises a same material as the second conductive film.

6. The display panel according to claim 1,
wherein the display region comprises a group of pixels, another group of pixels, a scan line, and a signal line,
wherein the group of pixels is arranged in a row direction,
wherein the group of pixels comprises the pixel,
wherein the another group of pixels is arranged in a column direction intersecting the row direction,
wherein the another group of pixels comprises the pixel,
wherein the scan line is electrically connected to the group of pixels, and
wherein the signal line is electrically connected to the another group of pixels.

7. A display device comprising:
the display panel according to claim 1; and
a control portion,
wherein the control portion is supplied with image data and control data,
wherein the control portion generates data on the basis of the image data,
wherein the control portion generates a control signal on the basis of the control data,
wherein the control portion supplies the data and the control signal,
wherein the display panel is supplied with the data and the control signal, and
wherein the pixel performs display on the basis of the data.

8. An input/output device comprising:
an input portion and a display portion,
wherein the display portion comprises the display panel according to claim 1,
wherein the input portion comprises a sensing region,
wherein the input portion senses an object approaching the sensing region, and
wherein the sensing region comprises a region overlapping with the pixel.

9. A data processing device comprising:
an arithmetic device and an input/output device,
wherein the arithmetic device is supplied with input data or sensing data,
wherein the arithmetic device generates control data and image data on the basis of the input data or the sensing data,
wherein the arithmetic device supplies the control data and the image data,
wherein the input/output device supplies the input data and the sensing data,
wherein the input/output device is supplied with the control data and the image data,
wherein the input/output device comprises a display portion, an input portion, and a sensing portion,
wherein the display portion comprises the display panel according to claim 1,
wherein the display portion displays the image data on the basis of the control data,
wherein the input portion generates the input data, and
wherein the sensing portion generates the sensing data.

10. A data processing device comprising one or more of a keyboard, a hardware button, a pointing device, a touch sensor, an illuminance sensor, an imaging device, an audio input device, an eye-gaze input device, and an attitude detection device, and the display panel according to claim 1.

* * * * *